(12) United States Patent
Richter et al.

(10) Patent No.: US 8,741,770 B2
(45) Date of Patent: Jun. 3, 2014

(54) SEMICONDUCTOR DEVICE AND METHOD FOR PATTERNING VERTICAL CONTACTS AND METAL LINES IN A COMMON ETCH PROCESS

(75) Inventors: Ralf Richter, Dresden (DE); Robert Seidel, Dresden (DE); Juergen Boemmels, Dresden (DE); Thomas Foltyn, Zwickau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/468,083

(22) Filed: May 10, 2012

(65) Prior Publication Data

US 2012/0220119 A1    Aug. 30, 2012

Related U.S. Application Data

(62) Division of application No. 12/103,765, filed on Apr. 16, 2008, now Pat. No. 8,198,190.

(30) Foreign Application Priority Data

Oct. 31, 2007   (DE) .......................... 10 2007 052 049

(51) Int. Cl.
*H01L 23/48*   (2006.01)
*H01L 21/4763*   (2006.01)

(52) U.S. Cl.
USPC .................... 438/634; 438/622; 257/E21.495

(58) Field of Classification Search
USPC ................................. 438/622, 634
See application file for complete search history.

(56) References Cited

U.S. PATENT DOCUMENTS

| | | | |
|---|---|---|---|
| 6,180,516 B1 | 1/2001 | Hsu | 438/638 |
| 6,287,961 B1 | 9/2001 | Liu et al. | 438/638 |
| 6,316,836 B1 | 11/2001 | Mayuzumi | 257/775 |
| 7,163,890 B2 | 1/2007 | Kang et al. | 438/638 |
| 7,262,127 B2 | 8/2007 | Ishikawa | 438/622 |
| 2002/0009675 A1 | 1/2002 | Jeng et al. | 430/312 |
| 2005/0263876 A1 | 12/2005 | Yew et al. | 257/701 |

FOREIGN PATENT DOCUMENTS

| | | | | |
|---|---|---|---|---|
| DE | 10 2004 027 663 A1 | 6/2004 | | H01L 43/12 |
| DE | 10 2005 036 548 A1 | 8/2005 | | H01L 21/8427 |
| EP | 1 107 308 A1 | 6/2001 | | H01L 21/768 |

OTHER PUBLICATIONS

Translation of Official Communication from German Patent Office for German Patent Application No. 10 2007 052 049.4 dated Jul. 7, 2010.
Translation of Official Communication from German Patent Office for German Patent Application No. 10 2007 052 049.4-33 dated Aug. 6, 2008.

*Primary Examiner* — Alexander Ghyka
(74) *Attorney, Agent, or Firm* — Amerson Law Firm, PLLC

(57) ABSTRACT

Interlayer connections, i.e., vertical connections, may be formed on the basis of a hard mask material, which may be positioned below, within or above an interlayer dielectric material, wherein one lateral dimension is defined by a trench mask, thereby obtaining a desired interlayer connection in a common patterning process. Furthermore, the thickness of at least certain portions of the metal lines may be adjusted with a high degree of flexibility, thereby providing the possibility of significantly reducing the overall resistivity of metal lines in metal levels, in which device performance may significantly depend on resistivity rather than parasitic capacitance.

4 Claims, 14 Drawing Sheets

SEMICONDUCTOR DEVICE AND METHOD FOR PATTERNING VERTICAL CONTACTS AND METAL LINES IN A COMMON ETCH PROCESS

CROSS-REFERENCE TO RELATED APPLICATION

This is a divisional of application Ser. No. 12/103,765, filed Apr. 16, 2008 now U.S. Pat. No. 8,198,190.

BACKGROUND OF THE INVENTION

1. Field of the Invention

Generally, the subject matter disclosed herein relates to the formation of integrated circuits, and, more particularly, to patterning dielectric materials used in metallization layers by means of sophisticated lithography and anisotropic etch techniques.

2. Description of the Related Art

In modern integrated circuits, minimum feature sizes, such as the channel length of field effect transistors, have reached the deep sub-micron range, thereby steadily increasing performance of these devices in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip, thereby typically requiring a plurality of stacked wiring levels or metallization layers to accommodate the required number of interconnect structures. The wiring levels typically comprise metal lines, which are connected to metal regions and metal lines of adjacent metallization layers of the wiring layer stack by vertical contacts, also referred to as vias.

In advanced integrated circuits, a limiting factor of device performance may be the signal propagation delay caused by the switching speed of the transistor elements and the electrical performance of the wiring levels of the devices, which may be determined by the resistivity (R) of the metal lines and parasitic capacitance (C) that may depend on spacing of the interconnect lines, since the line-to-line capacitance is increased in combination, while a reduced conductivity of the lines may result from their reduced cross-sectional area. While in some metallization levels, the RC time constants are the predominant factor that determines the overall performance, in other levels, a high series resistance of the metal lines due to design restriction in view of the line width may result in high current densities, which may lead to degraded performance and reduced reliability clue to increased electromigration, i.e., a current induced material flow caused by high current densities.

Traditionally, metallization layers are formed in a dielectric layer stack including, for example, silicon dioxide and/or silicon nitride, with aluminum as the typical metal. Since aluminum exhibits significant electromigration at higher current densities than may be necessary in integrated circuits having extremely scaled feature sizes, aluminum is being replaced by copper or copper alloys, which have a significantly lower electrical resistance and a higher resistivity against electromigration. Moreover, a further decrease of the parasitic RC time constants may be achieved by replacing the well-established and well-known dielectric materials silicon dioxide ($k \approx 4.2$) and silicon nitride ($k>5$) by so-called low-k dielectric materials. However, the transition from the well-known and well-established aluminum/silicon dioxide metallization layer to a low-k dielectric/copper metallization layer is associated with a plurality of issues to be dealt with.

For example, copper and alloys thereof may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper-based lines. Typically, in the damascene technique, the dielectric layer is deposited and then patterned with trenches and vias that are subsequently filled with copper by plating methods, such as electroplating or electroless plating. In many damascene strategies, the openings for the vias and the metal lines are formed first and the metal is subsequently filled in during a common deposition process.

Due to the ongoing shrinkage of device features of the transistor elements, and since typically the number of interconnections between the respective circuit elements is greater than the number of circuit elements, a moderately high number of stacked metallization layers have to be provided, wherein the interlayer connection may be provided by respective vertical connections or vias, as previously explained. The conventional damascene approach involves the lithographical patterning of a resist layer, which in turn may be used for patterning a hard mask material since, in highly advanced lithography techniques, short wavelength exposure radiation may be used in combination with respective resist materials, which may have to be applied with a reduced thickness, thereby typically not allowing a direct patterning of the interlayer dielectric material merely on the basis of a resist mask. In particular, the patterning of the vertical interlayer connections, i.e., the vias, having an aspect ratio of 5 and higher with a lateral dimension of approximately 100 nm and less, represent a technological challenge to reliably form the via openings and subsequently fill the openings along with respective trenches that are formed in an upper portion of the interlayer dielectric material. For example, well-established strategies are known as "via first, trench last" or "trench first, via last" approaches, in which, in the former approach, the via openings are formed on the basis of a lithography process followed by an anisotropic etch process. Thereafter, the trench is formed on the basis of a respective lithography mask and subsequently this mask is used for etching a portion of the interlayer dielectric material to provide the trench that connects to the previously formed via opening. In the latter approach, the trench may be formed first on the basis of lithography and etch techniques, followed by a lithography process to define a via portion within the trench and subsequently perform an anisotropic etch process to actually form the via opening through the entire interlayer dielectric material. Consequently, a plurality of complex interrelated process steps are typically required in conventional strategies according to a dual inlaid technique, which, however, provides efficient metal deposition processes, since thereafter any barrier materials and the highly conductive metal may be formed in the via opening and the trench in a common process sequence.

However, in view of enhanced device reliability, in particular of the metallization system of advanced semiconductor devices, the continuous drive for reducing critical feature sizes may result in significantly increased complexity and thus non-uniformities of the critical patterning process, in particular in the formation of the via openings, which may therefore result in performance degradation of the metallization system and thus of the entire integrated circuit.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to methods and devices for providing enhanced metallization systems for advanced semiconductor devices, wherein the patterning regime for interlayer connections, i.e., vertical electrical connections between adjacent stacked metal layers, may be enhanced by defining the lateral position and size and shape of the interlayer connection on the basis of an appropriate mask independently from a respective etch process. That is, the actual patterning process for forming respective openings for the interlayer connection may be performed in combination with a trench patterning process, thereby significantly reducing the overall process complexity. For this purpose, the mask for defining openings of the interlayer connections may be provided at any appropriate stage during the patterning of a metal layer, wherein the complexity of the corresponding lithography process may be reduced compared to conventional strategies, since the mask may be provided in any appropriate form, for instance as a hard mask material, the patterning of which may be less critical compared to the patterning of the entire interlayer dielectric material. Furthermore, by patterning the opening for the interlayer connection during the trench etch process, the trench mask may be advantageously used for restricting the opening of the interlayer connection at least in one lateral direction, thereby significantly relaxing the constraints imposed by appropriately aligning the mask for defining the interlayer connection. Furthermore, the overall process time may be reduced due to a highly efficient usage of respective etch tools during the common formation of openings of the interlayer connection and the respective trenches.

One illustrative method disclosed herein comprises defining a lateral position of an interlayer connection between a first metal layer and a second metal layer of a semiconductor device by a first mask. The method further comprises forming a second mask configured to define a trench in a dielectric material formed between the first and second metal layers, wherein the trench corresponds to a metal line of the second metal layer. Additionally, the method comprises forming an opening for the interlayer connection and the trench in the dielectric material in a common etch process.

Another illustrative method disclosed herein relates to forming an interlayer connection between a first metal layer and a second metal layer. The method comprises forming a first mask above a first metal region located in the first metal layer, wherein the first mask specifies a size and lateral position of the interlayer connection. Additionally, the method comprises forming an interlayer dielectric material above the first metal layer and forming a second mask above the interlayer dielectric material in a non-patterned state thereof, wherein the second mask specifies a size and lateral position of a second metal region in the second metal layer. Finally, the method comprises etching the interlayer dielectric material in the non-patterned state using the first and second masks to form a first opening corresponding to the interlayer connection and a second opening corresponding to the second metal region.

One illustrative semiconductor device disclosed herein comprises a device layer and a first metal layer comprising a first metal line and a second metal line. The semiconductor device further comprises an interlayer dielectric material formed above the first metal layer. Additionally, a second metal layer is provided and is formed above the interlayer dielectric material and comprises a third metal line, wherein the third metal line comprises a first line portion formed above the first metal line and having a first thickness and also comprises a second line portion formed above the second metal line and having a second thickness that is less than the first thickness. Finally, the semiconductor device comprises an interlayer connection formed in the interlayer dielectric material so as to connect the first line portion of the third metal line with the first metal line.

BRIEF DESCRIPTION OF THE DRAWINGS

The disclosure may be understood by reference to the following description taken in conjunction with the accompanying drawings, in which like reference numerals identify like elements, and in which:

FIGS. 1$b$-1$c$ schematically illustrate cross-sectional views of the device of FIG. 1$a$ during different manufacturing stages in forming an interlayer dielectric material and a mask layer for defining openings for an interlayer connection according to illustrative embodiments;

FIG. 1$d$ schematically illustrates a top view of the device of FIG. 1$c$;

FIGS. 1$e$-1$g$ schematically illustrate cross-sectional views of the semiconductor device as shown in the previous figures in various manufacturing stages when forming a metal line and an interlayer connection according to illustrative embodiments;

FIGS. 1$h$-1$i$ schematically illustrate top views of two stacked metal layers in which the lateral extension of the interlayer connection may be adjusted on the basis of the degree of coverage of the underlying metal layer by a mask used for defining the lateral position of the interlayer connection according to illustrative embodiments;

FIG. 1$j$ schematically illustrates a cross-sectional view of a metal layer and an interlayer dielectric material having formed therein a mask, wherein a height position may be adjusted on the basis of device requirements according to further illustrative embodiments;

FIGS. 1$k$-1$p$ schematically illustrate cross-sectional views of a semiconductor device during various manufacturing stages in which a mask for defining the position of the interlayer connection may be formed prior to the deposition of the interlayer dielectric material according to further illustrative embodiments;

Figure 1A:
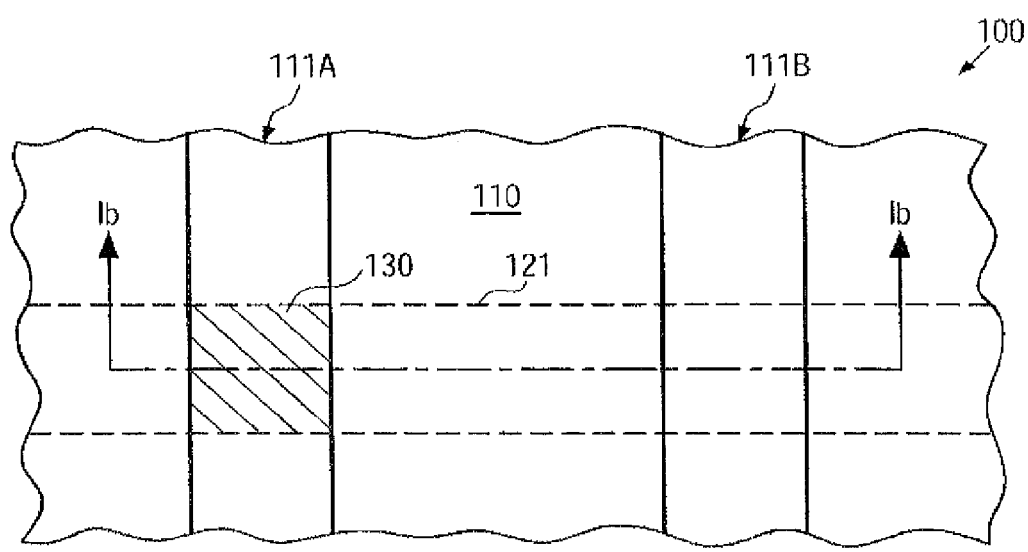
FIG. 1$a$ schematically illustrates a top view of a metallization system including a first metal layer and a second metal layer comprising respective metal lines at an initial manufacturing stage according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to techniques and corresponding semiconductor devices in which metallization systems of semiconductor devices may be formed on the basis of an enhanced patterning regime in order to relax patterning-related constraints. To this end, the actual patterning process for forming an opening for a vertical electrical connection or via, which will also be generally referred to as an interlayer connection, and a trench for defining a metal line or any other metal region in an overlying metallization layer or metal layer may be at least partially performed in a common etch process. That is, an appropriate mask, such as a resist mask, a hard mask and the like, may be used for defining the lateral size and position of a metal region, such as a metal line in a metal layer wherein, during the patterning process, on the basis of the trench mask, the respective opening for the interlayer connection may also be defined on the basis of a respective mask, which may be provided below or within the interlayer dielectric material. In some illustrative aspects disclosed herein, the mask for defining the lateral position and size of an area of the interlayer connection may be defined prior to forming the mask corresponding to the trench opening, wherein a respective patterning regime for defining the mask for the interlayer connection may be performed on the basis of less restrictive process constraints compared to a patterning regime for actually forming a via opening in an interlayer dielectric material according to well-established dual damascene strategies.

In other illustrative techniques disclosed herein, defining the mask for the interlayer connection may be performed after forming a significant portion of the respective trench within the interlayer dielectric material, thereby enabling the usage of a plurality of appropriate mask materials, such as photoresist, polymer materials and the like. In general, the combination of at least a significant portion of the patterning process for the interlayer connection and a respective metal line of a subsequent metallization layer provides the possibility of defining a respective metal line depth or thickness on the basis of a mask material designed to define the lateral dimensions of the interlayer connection, which may result, in addition to a reduced process complexity, in increased metal line thickness, at least partially, thereby also reducing the overall series resistance of the respective metal lines. In many cases, the performance of a respective metallization level may be substantially determined by the overall resistance of the metal features contained therein, while the parasitic capacitance may be less relevant in the metallization level under consideration, therefore an enhanced electrical performance may be obtained, wherein the enhanced patterning regime also contributes to increased reliability and reduced manufacturing costs.

It should be appreciated that in the specification and the appended claims a metal layer may be referred to, which may represent a metal system of a semiconductor device, in which a plurality of metal lines may be provided, which may be considered as inner level conductors and may also represent a region of the metallization system of a semiconductor device in which metal regions are contained, at least some of which may have a line-like configuration, i.e., having a first lateral dimension, referred to as a length direction, that is significantly greater than a second lateral dimension, i.e., a width direction. Moreover, two vertically adjacent metal layers may be connected on the basis of an appropriate area extending from one metal line or metal region of an upper layer to another metal line or metal region of the lower lying layer, wherein a respective "vertical" electrical contact may be referred to as an interlayer connection, irrespective of the actual vertical extension of the connection and the lateral size thereof. As will be described later on in more detail, the lateral extension of a respective interlayer connection may significantly differ, depending on device and process requirements, while a vertical extension thereof may also differ depending on the depth or thickness of a metal line or metal region contained in the overlying layer. In the context of the specification and the appended claims, any positional statements are to be considered as relative positional information, wherein a substrate material may be considered as a reference. For example, a first layer is located above a second layer, when a distance of the first layer to the reference, i.e., surface of a substrate material and the like, is greater than a distance of the second layer with respect to the reference.

Similarly, a lateral direction represents a direction substantially parallel to a substrate surface and the like, while a vertical direction is substantially perpendicular to a lateral direction.

FIG. 1a schematically illustrates a top view of a semiconductor device 100 which may represent any semiconductor device requiring a metallization system including a plurality of metal layers for establishing respective electrical connections between individual circuit elements. For example, the semiconductor device 100 may represent a complex integrated circuit requiring a plurality of metal layers including metal regions, such as metal lines, at least some of which may require a vertical connection, i.e., an interlayer connection, to a vertically adjacent further metal layer. As previously explained, sophisticated integrated circuits, such as complex CPUs, may require up to eleven or more metal layers, wherein a plurality of metal lines may be provided having specified lateral dimensions depending on the metal layer under consideration and the respective design rules of the semiconductor device of interest. As shown, the semiconductor device 100 may comprise a first metal layer 110 which may be comprised of any appropriate dielectric material, such as "conventional" dielectric materials in the form of silicon dioxide, silicon nitride, silicon oxynitride, silicon carbide, nitrogen-enriched silicon carbide and the like. In addition to or alternatively, the metal layer 110 may comprise, at least partially, a low-k dielectric material, i.e., a material having a relative permittivity of 3.0 or less. Furthermore, the metal layer 110 may comprise a plurality of metal lines 111A, 111B wherein, for convenience, only two metal lines may be shown. The metal lines 111A, 111B may comprise any appropriate conductive material, such as highly conductive metals in the form of copper, copper alloys, silver, silver alloys, aluminum and the like, wherein possibly respective other materials, such as conductive barrier material, alloys and the like, may at least be partially provided at specific areas of the metal lines 111A, 111B. Furthermore, the lateral dimensions of the lines 111A, 111B may be determined by the overall design criteria to provide the required number of electrical connections while also respecting the electrical performance of the lines 111A, 111B, for instance with respect to electromigration, signal propagation delay and the like. As shown, in some illustrative embodiments, the metal lines 111A, 111B may extend in a substantially parallel manner, which may be advantageous in view of reducing parasitic capacitance in view of any vertical stacked metal layers, that is, any metal layer provided in a direction perpendicular to the drawing plane of FIG. 1a. In other cases, the metal lines 111A, 111B may extend in different directions, depending on the process and device requirements. Moreover, in the manufacturing stage shown in FIG. 1a, the semiconductor device 100 may be prepared for receiving a further metal layer in which one or more further metal lines 121 (shown in dashed lines) may be provided, wherein, at certain positions, a vertical connection between one or more of the underlying metal lines 111A, 111B and the one or more metal lines 121 may be required in accordance with a circuit arrangement of circuit elements formed in a lower lying device layer (not shown). For example, an area 130 may represent an interlayer connection area in which a direct electrical contact between the metal line 111A and the line 121 still to be formed is to be established.

Figure 1B:
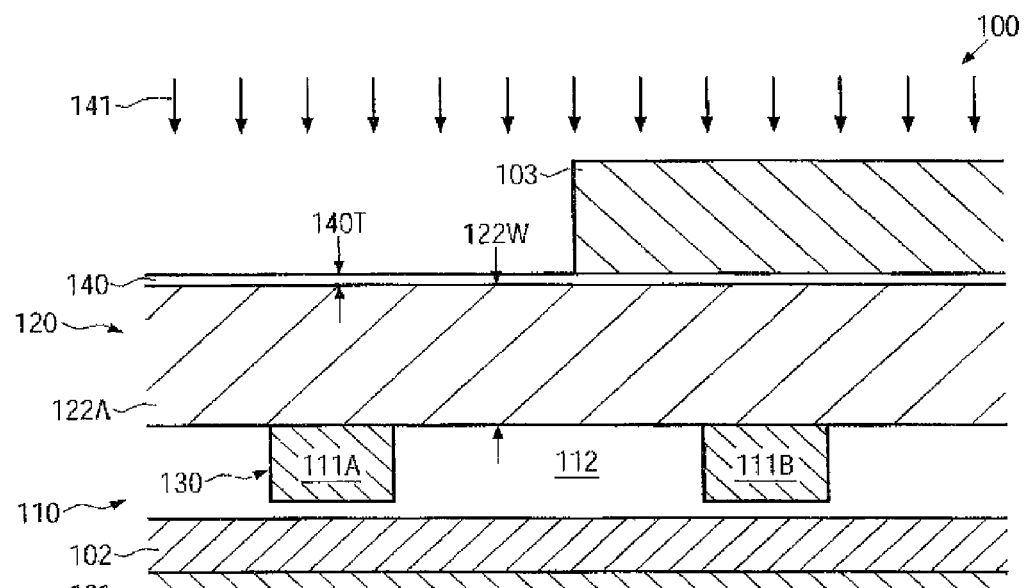

FIG. 1b schematically illustrates a sectional view along the line Ib as shown in FIG. 1a of the semiconductor device 100 during an advanced manufacturing stage when forming a metal layer containing the metal line 121 and the interlayer connection 130, according to illustrative embodiments. As shown, the semiconductor device 100 may comprise a substrate 101, which may represent any appropriate carrier material for forming therein and thereabove circuit elements requiring electrical connections formed on the basis of one or more metal layers, such as the metal layer 110. For example, in advanced logic circuits, the substrate 101 may represent a silicon-based substrate, such as a silicon bulk substrate, a silicon-on-insulator (SOI) substrate, a substrate including a mixed configuration of a bulk architecture and an SOI architecture and the like. Furthermore, above the substrate 101, a device layer 102 is provided, i.e., a plurality of materials and layers representing the plurality of circuit elements, such as transistors, capacitors and the like, that are at least partially formed in a semiconductor layer of appropriate configuration. As previously explained, respective circuit elements may have critical dimensions of approximately 50 nm and less, depending on the technology standard used for the definition of respective circuit elements. For convenience, any such circuit elements are not shown within the device layer 102. It should be appreciated that the device layer 102 may also comprise appropriate contact structures providing direct electrical contact of the circuit elements in the device layer 102 with a first metal layer formed above the device layer 102. For convenience, any such contact structures are not shown. Furthermore, it may be assumed that the metal layer 110 is formed above the device layer 102, wherein it should be appreciated that the metal layer 110 may represent any of a plurality of stacked metal layers, as previously explained. The metal layer 110 may comprise a dielectric material 112, which may have a configuration as previously explained. Furthermore, the metal lines 111A, 111B are formed within the dielectric material 112, wherein appropriate barrier material may be provided if a direct contact of the conductive material of the lines 111A, 111B with the dielectric material 112 may have to be suppressed, as, for instance, previously explained with reference to copper and copper alloys.

In this manufacturing stage, a first portion 122A of a dielectric layer of a second metal layer 120 may be formed above the metal layer 110, wherein the first dielectric portion 122A may be comprised of any appropriate material, such as conventional dielectrics, low-k dielectrics, as is also explained with reference to the dielectric layer 112. Moreover, a mask layer 140 may be provided on the first portion 122A, wherein the mask layer 140 may be comprised of any appropriate material having desired etch stop characteristics with respect to an anisotropic etch process that is to be performed in a later stage to pattern the first portion 122A and a second portion of the dielectric layer of the metal layer 120, which is still to be formed. For example, the mask layer 140 may be comprised of silicon nitride, silicon carbide, silicon oxynitride, silicon dioxide, depending on the etch selectivity with respect to the material of the portion 122A. In some illustrative embodiments, the portion 122A may be comprised of a low-k dielectric material wherein a plurality of appropriate dielectric materials may be available, such as silicon nitride and the like, which exhibit a high etch selectivity with respect to a plurality of well-established anisotropic etch techniques for patterning the low-k dielectric material of the portion 122A. Similarly, silicon dioxide or a plurality of polymer materials may be used in combination with respective low-k dielectric materials. Furthermore, a thickness 140T may be selected on the basis of process and device requirements, that is, the thickness 140T may be selected such that the required etch stop behavior may be obtained, while also the dielectric behavior of the layer 140 may be taken into consideration. For example, if the overall relative permittivity of the metal layer 120 should not be unduly increased, an appropriate material having only a moderately high relative permittivity may be selected, while the thickness 140T may then be adapted to ensure a reliable etch stop during the subsequent etch process. At any rate, the thickness 140T of the mask layer 140 may be significantly reduced compared to a thickness of dielectric material of the metal layer 120 that in conventional strategies may have to be patterned on the basis of a respective photolithography and etch regime. Thus, based on given lithography capabilities of a specific technology standard, the patterning of the mask layer 140 based on the thickness 140T may result in significantly reduced process constraints compared to a complex patterning regime for defining and etching a via opening in an interlayer dielectric material, as previously explained.

Moreover, the semiconductor device 100 may comprise a mask 103, such as a resist mask, which is designed to expose at least an area corresponding to the desired interlayer connection 130 (FIG. 1a), wherein, however, the lateral size of an area not covered by the mask 103 is less critical and may be intentionally selected so as to have greater dimensions compared to the actual interlayer connection still to be formed. That is, in some illustrative embodiments, the mask 103 may be formed in such a way that only portions of the device 100 are covered, in which electrical contact to an underlying metal line, such as the metal line 111B, is to be prevented, wherein a certain degree of safety margin may be included, while, in other cases, the mask 103 may cover substantially any portion of the device 100, except for respective regions in which an interlayer connection, such as the connection 130, is to be established to an underlying metal line, such as the metal line 111A. Also, in this case, a desired degree of process margin may be taken into consideration, thereby also significantly relaxing the overall process complexity of a respective photolithography process for patterning the mask 103. It should be appreciated that the mask 103, irrespective of whether it covers a moderately great portion or merely an area surrounding the contact portion 130 (FIG. 1a), determines the size of a respective interlayer connection in one lateral dimension, for example, in FIG. 1b, the horizontal dimension, since the actual size in the other horizontal direction, i.e., a direction perpendicular to the drawing plane of FIG. 1b, will be determined by a trench mask to be formed in a later manufacturing stage.

The semiconductor device 100 as illustrated in FIG. 1b may be formed on the basis of the following processes. After providing the substrate 101 having formed thereabove an appropriate semiconductor layer, which may represent the portion of the device layer 102, respective circuit elements, such as transistors and the like, may be formed by using well-established process techniques. A contact structure (not shown) may be formed to provide respective areas for connecting the circuit elements in the device layer 102 to one or more metal layers, such as the metal layer 110. It should be appreciated that, in some illustrative embodiments, the principles disclosed herein may also be applied to the first metallization layer when connecting to a respective contact structure, as will be explained later on. Next, the metal layer 110 may be formed by depositing the dielectric material 112, which may comprise any appropriate material composition, for instance, dielectric etch stop materials (not shown), a low-k dielectric material and the like. The dielectric material 112 may be deposited on the basis of any appropriate process techniques, such as spin-coating, chemical vapor deposition (CVD) and the like. Thereafter, a process sequence may be applied to form respective trenches for the metal lines 111A, 111B, wherein it should be appreciated that similar process techniques may also be applied, as will be described now with reference to the metal layer 120, when the metal layer 110 is to receive respective interlayer connection to respective metal lines of a low lying metal layer (not shown). For this purpose, established photolithography and patterning regimes may be used, wherein it is to be appreciated that generally the patterning of trench openings having a moderately great dimension, at least in the length direction of the metal lines, may be less critical during the photolithography and during the etch process compared to the definition of openings having critical dimensions in both lateral directions.

After the patterning of the respective trench openings, an appropriate conductive material may be filled into the trenches, for instance, on the basis of well-established techniques, which may include the deposition of appropriate conductive barrier materials, such as tantalum, tantalum nitride, titanium, titanium nitride, tungsten, tungsten nitride or any other appropriate metal-containing compositions and alloys, to obtain the desired mechanical, chemical and electrical performance of the metal lines 111A, 111B in combination with a highly conductive metal, such as aluminum, copper, copper alloys, silver, silver alloys and the like. For example, in sophisticated integrated circuits, copper may be frequently used as a base material of a highly conductive metal, which may be deposited by electrochemical deposition techniques. During the electrochemical deposition technique, requiring in conventional strategies the filling of via openings and trenches in a substantially void-free manner, as previously explained, appropriate electroless and/or electroplating techniques are used, wherein, for a reliable filling of the opening, a certain degree of excess material is usually deposited, which may then be removed, for instance on the basis of electrochemical etch techniques, electropolishing, chemical mechanical polishing (CMP) and the like. During the removal of any excess material, other conductive materials, such as barrier layers and the like, may also be removed from horizontal portions of the dielectric layer 112, thereby providing the electrically isolated metal lines 111A, 111B. Next, in some approaches, an appropriate cap layer (not shown) may be provided on the metal lines 111A, 111B and possibly also on the dielectric layer 112, depending on the process strategy. A respective cap layer may also be used as an etch stop layer in a later manufacturing stage, as will be described later on in more detail. Thereafter, according to the embodiment shown in FIG. 1b, dielectric material may be deposited to form the first portion 122A of a dielectric material for the metal layer 120. For this purpose, any appropriate deposition technique may be used, as is also explained for the dielectric layer 112. A thickness 122W of the first portion 122A may be selected in accordance with device and process requirements, thereby adjusting the depth of respective metal lines in the layer 120, such as the metal line 121, as indicated in FIG. 1a. As will be described later on in more detail, the principles disclosed herein provide the possibility to efficiently adjust, at least partially, the depth and thus thickness of the respective metal lines 121 by selecting the vertical position of the mask layer 140, wherein the mask layer 140 may be positioned with respect to the vertical position anywhere within the metal layer 120 and may even be formed above or below the dielectric material of the layer 120, as will be described later on.

After the deposition of the first portion 122A, the mask layer 140 may be formed on the basis of any appropriate technique wherein, depending on the characteristics of the material of the layer 140, similar process techniques may be used as are also used for the first portion 122A, while, in other cases, different deposition techniques and thus deposition tools may be used. For example, the mask layer 140 may be formed by depositing any appropriate material having the desired etch stop characteristics for a subsequent patterning regime, wherein material may be deposited in situ with the first portion 122A, if a change in precursor materials and deposition conditions may be established within the same process chamber. For example, when the dielectric material of the first portion 122A is formed on the basis of silicon, carbon, oxygen and hydrogen, the layer 140 may be provided in the form of a silicon dioxide layer having an enhanced density, thereby providing the desired etch stop capabilities. In other cases, materials such as silicon nitride, silicon carbide, nitrogen-enriched silicon carbide, silicon dioxide, silicon oxynitride may be used in any combination to form the layer 140. In still other illustrative embodiments, additionally or alternatively, a surface treatment process may be performed in order to form the mask layer 140 having the desired characteristics. For instance, oxidation, nitridation and the like may be performed on the basis of appropriate plasma-assisted atmospheres in order to provide the layer 140 with the desired thickness 140T and the desired etch stop characteristics. Next, the mask 103, for instance in the form of a resist material, may be deposited and may subsequently be patterned to expose a desired area of the mask layer 140, as previously explained. Thereafter, an etch process 141 may be performed to remove an exposed portion of the mask layer 140, thereby defining a first mask on the basis of which respective interlayer connections may be formed in a later phase during the patterning of respective trenches for metal lines in the metal layer 120, such as the metal line 121 as schematically indicated in FIG. 1*a*. The etch process 141 may be designed to exhibit a moderately high selectivity with respect to the underlying material of the first portion 122A, wherein, however, it should be appreciated that a highly pronounced etch selectivity may not be required since further material of the dielectric layer will be deposited in a subsequent manufacturing stage. In some cases, the etch process 141 may be performed on the basis of well-established recipes, which are available for a plurality of dielectric materials. For instance, the process 141 may be performed as a plasma-assisted process or a wet chemical process, depending on the characteristics of the materials of the layers 140 and 122A. It should be appreciated that, due to the less critical constraints with respect to a lateral size of the portion exposed by the mask 103 and due to the reduced thickness 140T compared to the thickness of a typical dielectric material of a metal layer, both the previous lithography process for patterning the mask 103 and the etch process 141 may be significantly less critical compared to the patterning sequence of a conventional via opening.

Figure 1C:
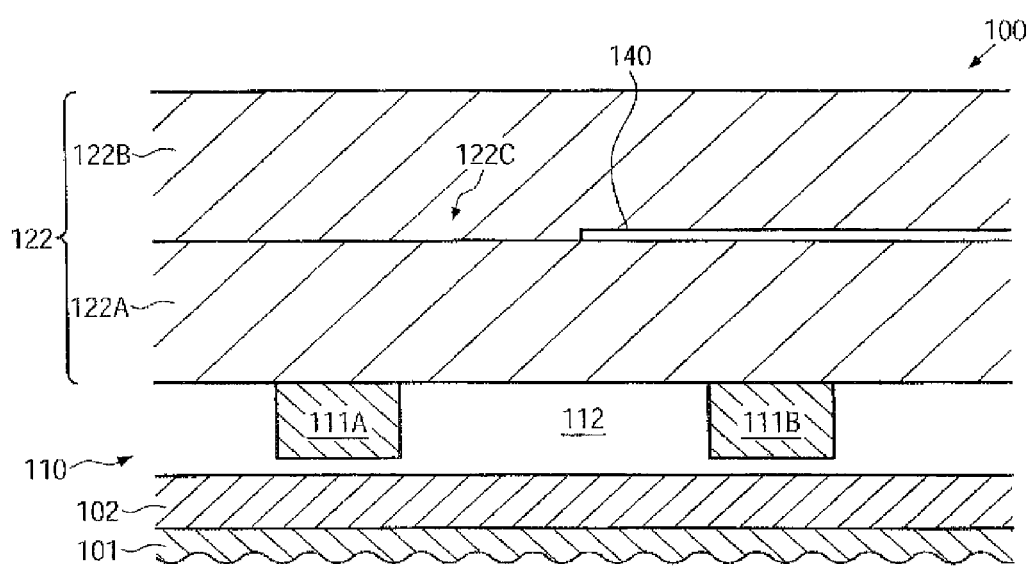

FIG. 1*c* schematically illustrates a cross-sectional view of the semiconductor device 100 after the completion of the etch process 141, thereby removing a portion of the mask layer 140 that has been exposed by the mask 103, while a second portion 122B of dielectric material is formed above the first portion 122A, thereby defining a dielectric layer 122 of the metal layer 120. Consequently, the mask layer 140 is vertically positioned within the dielectric layer 122 at a desired height position to define a depth of respective trenches to be formed in the dielectric material 122 while exposing an area 122C, in a portion of which the metal lines still to be formed may extend down to the underlying metal layer 120, thereby also establishing a direct electrical contact to the metal line 111A in order to provide an interlayer connection such as connection 130 as shown in FIG. 1*a*. For this purpose, a further mask may be formed above the dielectric layer 122, for instance in the form of a resist mask, a hard mask or a combination thereof, to define the size and position of the trenches used to form respective metal lines, such as the metal line 121 (FIG. 1*a*). For this purpose, respective process techniques may be applied as in conventional strategies during a dual damascene technique, when trenches for metal lines are to be formed. As previously explained, the lithography process for defining an opening having at least in one direction a non-critical dimension may be performed on the basis of less restricted process margins compared to a highly critical via patterning regime based on conventional techniques.

Figure 1D:
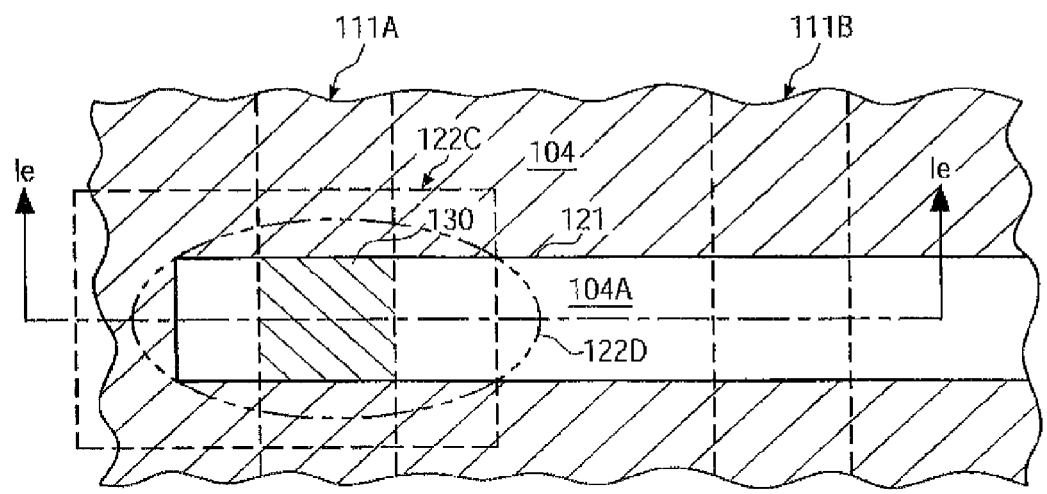

FIG. 1*d* schematically illustrates a top view of the semiconductor device 100 after forming a mask 104 which exposes a portion of the dielectric layer 122, thereby defining a trench 104A in the mask material 104 which substantially corresponds to the size and position of a trench and thus the metal line 121 still to be formed in the dielectric layer 122. For convenience, any device areas defined by lower lying features, such as the exposed portion 122C (FIG. 1*c*) and the metal lines 111A, 111B are illustrated in dashed lines so as to more clearly indicate the positional relationship of these areas with respect to trench 104A. As indicated, the portion 122C, i.e., the portion in which the mask layer 140 (FIG. 1*c*) is not formed, defines a "section" with the trench 104A wherein the area of this section, indicated as 122D, defines a device region in which a respective trench and thus metal line will extend down to the metal layer 110, thereby also providing the direct contact with the metal line 111A. For convenience, the portion 122D, in which the metal line 121 still to be formed may extend down to the metal layer 110, will also be referred to as interlayer connection, while, however, an actual direct electrical contact may be established within the portion 130 only. As illustrated, the portion 122D is thus defined by two masks, i.e., the mask 104 defining the trench 104A and the mask 140, both of which may be formed on the basis of less critical process conditions during the photolithography process, wherein the actual patterning of the mask layer 140 may also be performed on the basis of less critical etch conditions, as previously explained.

Figure 1E:
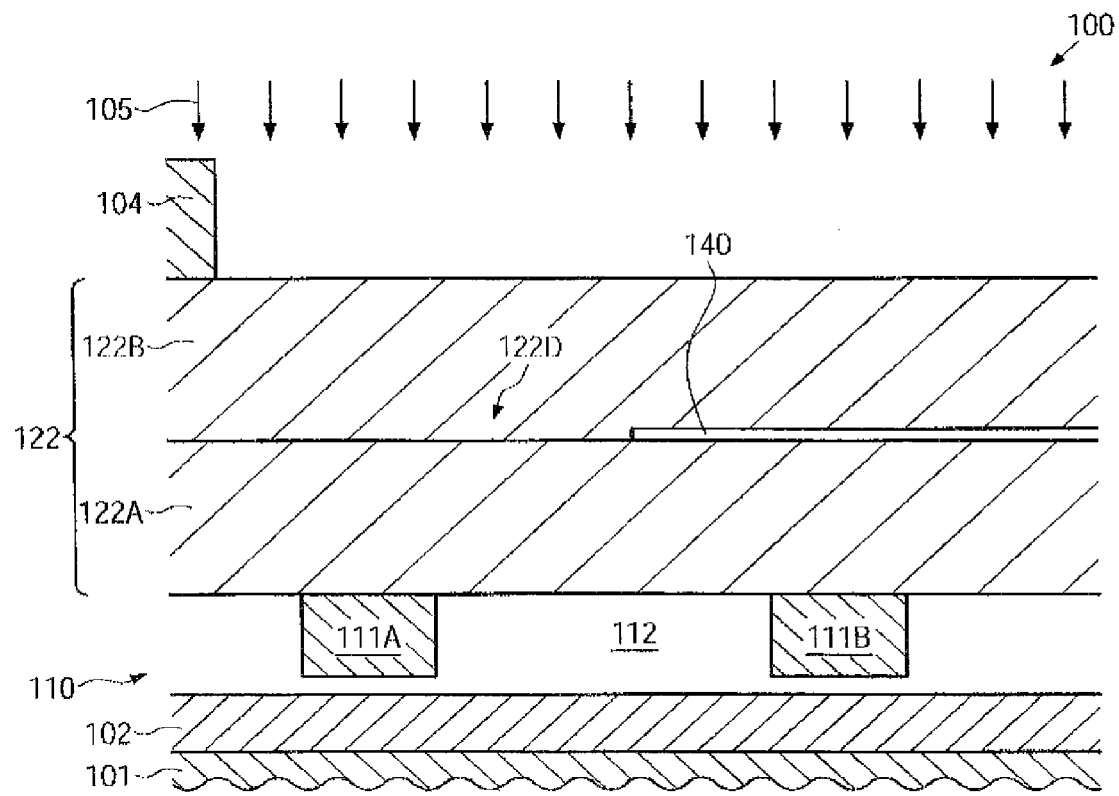

FIG. 1*e* schematically illustrates a sectional view of the semiconductor device 100 as indicated by the line Ie in FIG. 1*d*, wherein the device is subjected to an etch process 105 for patterning the dielectric layer 122 on the basis of the masks 104 and 140. The etch process 105 may be performed on the basis of well-established anisotropic etch recipes, wherein, in some illustrative embodiments, the mask 104 may be comprised of an appropriate hard mask material, possibly in combination with a resist material, depending on the process strategy. For example, as previously explained, sophisticated lithography techniques may require resist materials of reduced thickness, which may possibly not provide sufficient etch selectivity during the process 105. For this purpose, any appropriate hard mask material, which may also act as an anti-reflective coating (ARC), may be used to commonly define the mask 104. During the anisotropic etch process 105, exposed material of the layer 122, i.e., in a first phase of the portion 122B, may be efficiently removed, while the progression of the etch front may be reliably stopped on and in the mask layer 140 while the etch process continues in the exposed portion 122D (FIG. 1*d*). The etch process 105 may be stopped upon exposing the metal layer 110, wherein it should be appreciated that the metal layer 110 may comprise an appropriate cap layer, which may also act as an etch stop layer, as will be described later on in more detail. Thus, if an exposure of a portion of the metal line 111A is considered inappropriate during the etch process 105 and/or if the etch stop capabilities of the metal of the line 111A and of the dielectric material of the layer 110 are insufficient for providing reliable control of the etch process 105, the end of the process 105 may be determined on the basis of an etch stop layer, which may be subsequently open, as, for instance, also in conventional strategies when opening the bottom of respective vias.

Figure 1F:
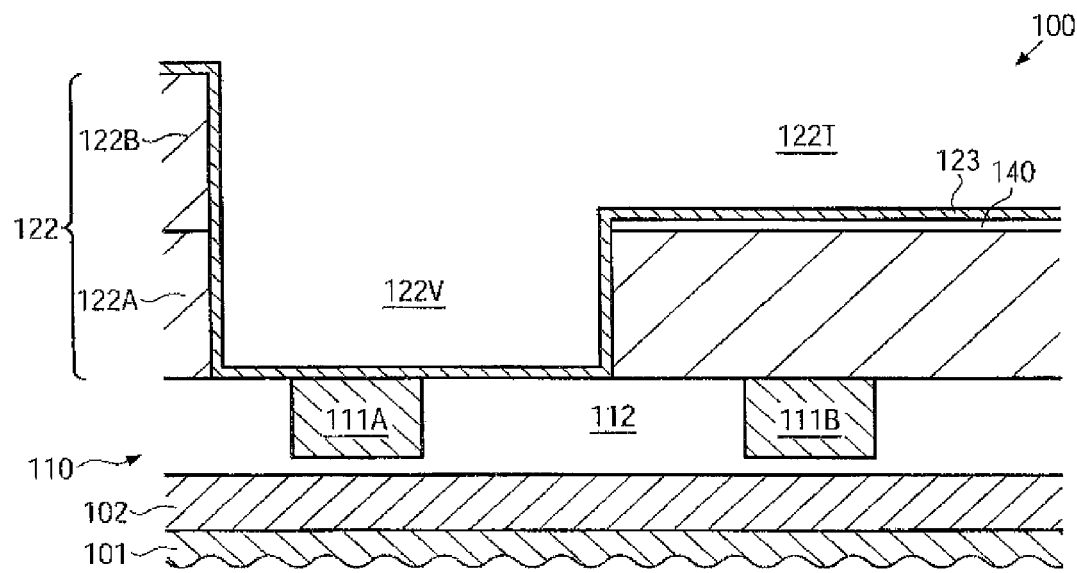

FIG. 1*f* schematically illustrates the semiconductor device 100 in a further advanced manufacturing stage. As shown, the dielectric layer 122 comprises a trench 122T substantially corresponding to the trench 104A (FIG. 1*d*) and also comprises an opening 122V, corresponding to the section 122D (FIG. 1*d*) defined by the masks 104 and 140, as previously explained. Moreover, a conductive barrier layer 123 may be formed within the openings 122V and 122T, as well as on horizontal portions of the dielectric layer 122, when direct contact of a highly conductive metal with the material of the dielectric layer 122 and 112 is considered inappropriate. For example, a plurality of appropriate barrier materials in combination with copper-based metallization regimes are well-established in the art and may be used for the barrier layer 123. The material of the barrier layer 123 may be formed on the basis of any appropriate deposition technique, such as chemical vapor deposition, including atomic layer deposition (ALD) techniques, in which a self-limiting chemistry may be used to provide thin material layers in a highly controlled fashion, physical vapor deposition, such as sputter deposition, electroless deposition and the like. Thereafter, a highly conductive material, such as copper, copper alloys, silver and the like, may be deposited on the basis of well-established deposition techniques, such as electrochemical deposition processes, as may also be used in conventional strategies. After the deposition of the highly conductive metal, typically any excess material may be removed while also planarizing the surface topography in order to obtain enhanced condition for the formation of further layers, if required.

Figure 1G:
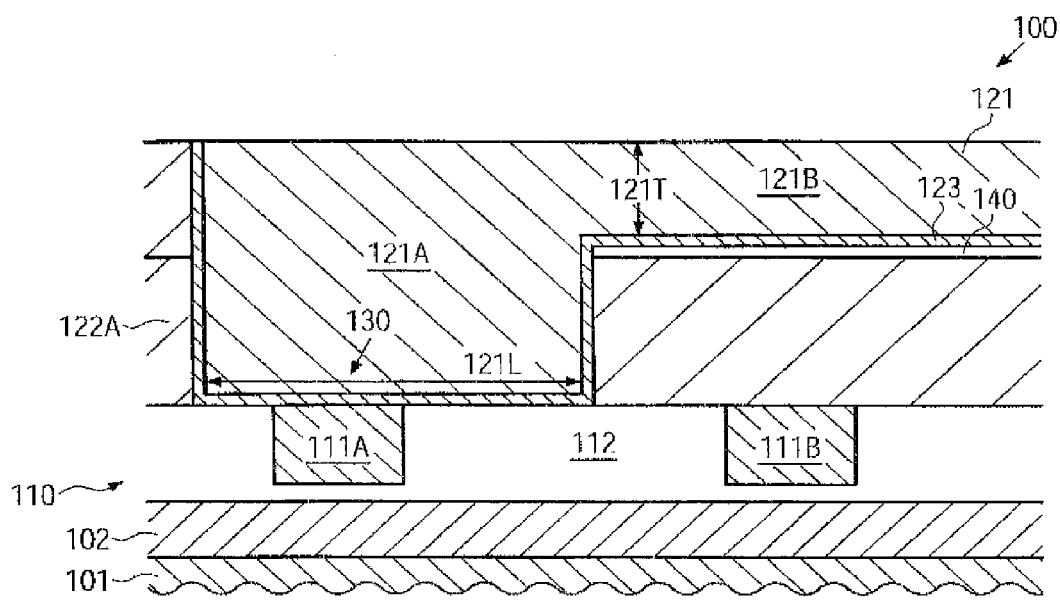

FIG. 1*g* schematically illustrates the semiconductor device 100 after the completion of the above-described process sequence. As shown, the metal line 121 and the interlayer connection 130 may be formed on the basis of any appropriate material, such as copper and the like, wherein the metal line 121 may comprise a line portion 121B having a thickness 121T that is substantially determined by the vertical position of the mask layer 140, as previously explained, while another line portion 121A may have a thickness that corresponds to the thickness of the dielectric layer 122. Thus, the interlayer connection 130 may be considered as an integral component of the line portion 121A having a "maximum" depth, since it extends across the entire dielectric layer 122 in the depth direction. Thus, the interlayer connection 130 may be formed on the basis of less critical process conditions, in particular with respect to the photolithography, wherein, additionally, the respective openings 122V and 122T (FIG. 1*f*) may be formed in a common etch process performed on the basis of the masks 140 and 104, thereby significantly enhancing the overall process flow. Furthermore, the thickness of the line portion 121T may be determined on the basis of the mask layer 140, while also the lateral extension of the line portion 121A may be defined by the mask 140, thereby providing a high degree of design flexibility in adapting the electrical performance of the metal line 121. That is, depending on the lateral size of the line portion 121A, a significant reduction of electrical resistance may be accomplished for the metal line 121, thereby enhancing the performance in device levels, in which a low series resistance may be advantageous, while parasitic capacitance is less relevant, as explained before.

Figure 1H:
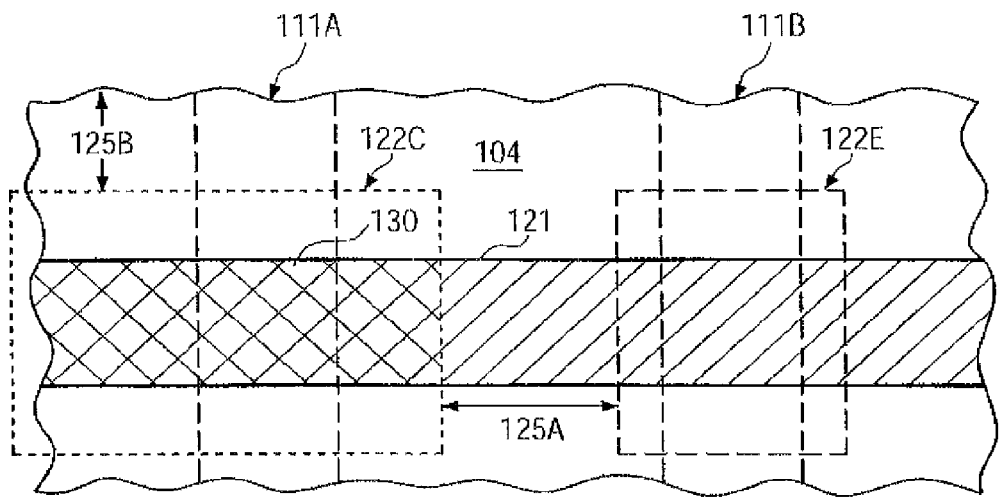

FIG. 1*h* schematically illustrates a top view of the semiconductor device 100, in which it is illustrated how the lateral dimensions of the line portions 121B and 121A may be readily adjusted on the basis of the degree of coverage of the mask 140. As illustrated, the dotted line represents the exposed portion 122C, wherein the exposed portion 122C is restricted to the neighborhood of the actual contact area 130, thereby also restricting the lateral dimension of the line portion 121A. However, if the lateral size of the line portion 121A is to be increased, for instance in view of reducing the overall resistance of the metal line 121, the non-covered portion 122C may be extended, at least in a direction as indicated by 125A, wherein a maximum extension in this direction is determined by the position of the metal line 111B, for which a direct electrical contact with the line 121 is to be prevented. Similarly, the lateral size of the non-covered portion 122C may also be extended in the direction 125B, perpendicular to the direction 125A, wherein, however, a corresponding extension of the mask 140 may not influence the lateral size of the line portion 121A since the lateral size in the direction 125B is determined by the mask 104 that therefore determines the actual width of the metal line 121. Upon extending the lateral size of the non-covered portion 122C in the direction 125B, the position of any further interlayer connection to be formed on the basis of any further metal lines (not shown) have to be taken into consideration so as to not establish a contact at areas in which direct electrical contact is to be prevented. For example, when extending the lateral size of the exposed portion 122C in both directions 125A, 125B, a degree of coverage may be obtained for the mask 140, where merely portions not requiring an interlayer connect to the lower lying metal line may remain covered, as is for instance shown for the metal line 111B. In this case, the non-covered portion 122C may occupy the entire area except for a portion 122E, indicated in dashed lines, which represents the remaining material of the mask 140 in this area, thereby reliably preventing an exposure of the metal line 111B during the previously described patterning process for obtaining the openings 121V and 121T. Thus, in this case, the lateral extension of the line portion 121A having the "maximum" thickness may therefore be increased while reducing the length of the portion 121B having the reduced thickness 121T, thereby resulting in a low overall resistance of the metal line 121.

Figure 1I:
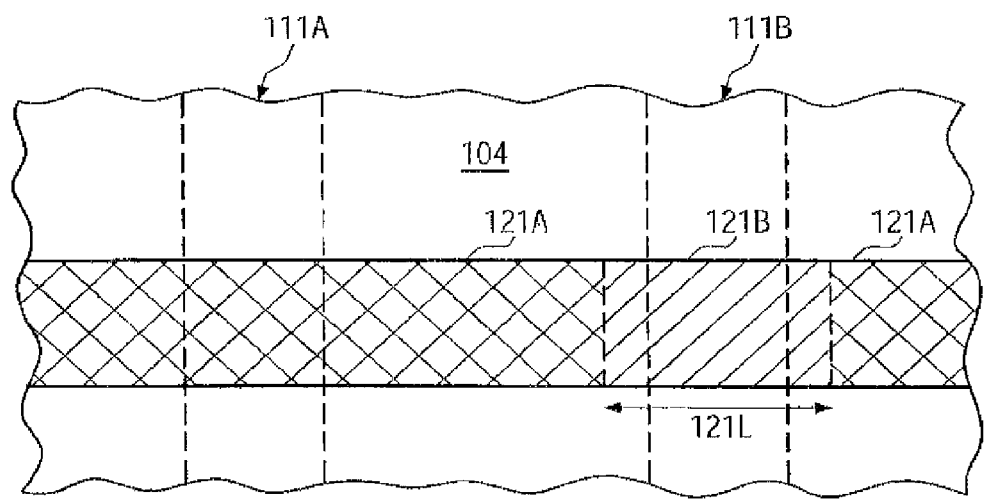

FIG. 1*i* schematically illustrates a top view of the semiconductor device 100, when the metal line 121 is formed on the basis of the mask layer 140 having a configuration as defined by the portion 122E, i.e., the mask material may be provided in the vicinity of the section between the line 121 and the metal line 111B only, as previously explained. Thus, line portions having a maximum thickness, indicated as line portions 121A, may be interrupted by line portions 121B having the thickness 121T in device areas in which the metal line 121 crosses an underlying metal line, such as the metal line 111B, for which an interlayer connection is not desired. It should be appreciated that, for increasing the lateral size of the line portions 121A, it may not be necessary to extend the lateral size of the non-exposed portions 122C in the direction 125B, as for instance shown in FIG. 1*h* with respect to the portion 122E, but it may suffice to merely extend the non-exposed portion 122C along the lateral direction 125A, thereby defining stripe-like mask features in the mask 140 extending along the metal line 121. Consequently, by adjusting the lateral size of the line portions 121A, the overall resistance of the metal line 121 may be adapted in conformity with device requirements.

Figure 1J:
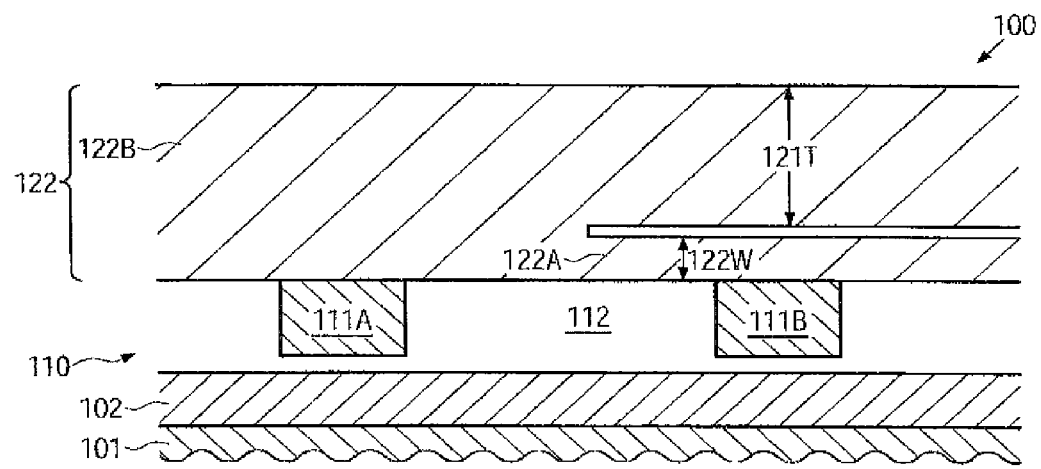

FIG. 1*j* schematically illustrates the semiconductor device 100 in cross-sectional view according to further illustrative embodiments, in which the thickness 121T of the metal line 121 may be adjusted on the basis of the vertical position of the mask 140 within the dielectric layer 122. For example, the overall resistance of the metal line 121 may also be adjusted on the basis of the thickness 121T of the line portions formed above a lower lying metal line, to which an interlayer connection is not desired. For this purpose, the deposition of the mask material 140 may be performed at any appropriate manufacturing stage when forming the dielectric layer 122, that is, the first portion 122A (FIG. 1b) may be formed with any appropriate thickness 122W followed by the deposition of the layer 140, as previously explained, thereby defining the thickness or depth 121T of the metal line 121 for a given total thickness of the dielectric layer 122. The patterning of the mask material 140 may then be performed on the basis of the same strategies as previously described, wherein the degree of coverage and the vertical position of the mask 140 thus may both be usable to adjust the overall electrical performance of the metal line 121.

Figure 1K:
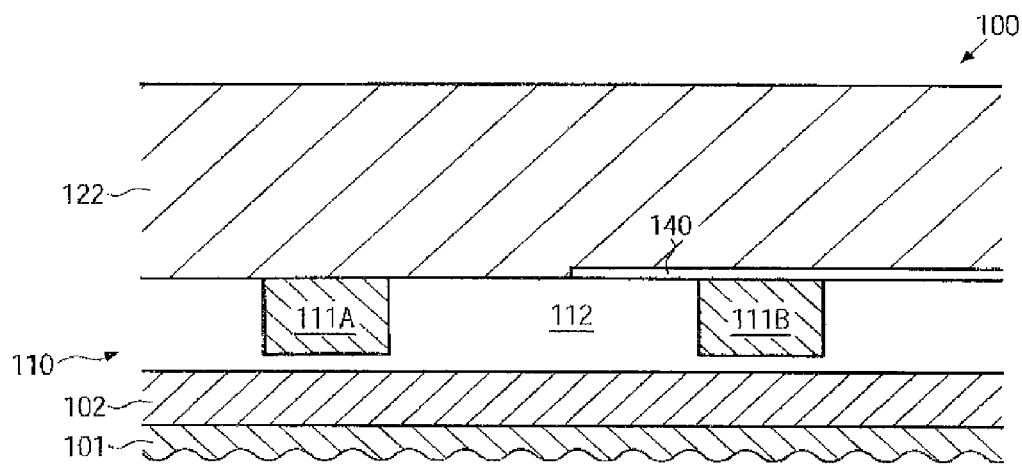

FIG. 1k schematically illustrates the semiconductor device 100 in accordance with embodiments in which the mask 140 may be formed prior to the deposition of the material of the dielectric layer 122. For this purpose, the material of the mask 140 may be formed after completing the metal layer 110 and may be patterned on the basis of process strategies, as previously described, wherein the lateral size of a portion covered by the mask 140 may be adjusted on the basis of the principles discussed above. Thereafter, the dielectric layer 122 may be formed on the basis of any appropriate technique, as previously explained. Thus, upon patterning the dielectric layer 122 on the basis of the mask 140, as previously described, the respective etch process 105 (FIG. 1e) may be reliably stopped within the material, of the mask 140, thereby defining the line portions 121B (FIG. 1i) wherein the thickness 121T (FIG. 1j) thereof is now defined by the thickness of the layer 140 for a given thickness of the dielectric layer 122.

Figure 1L:
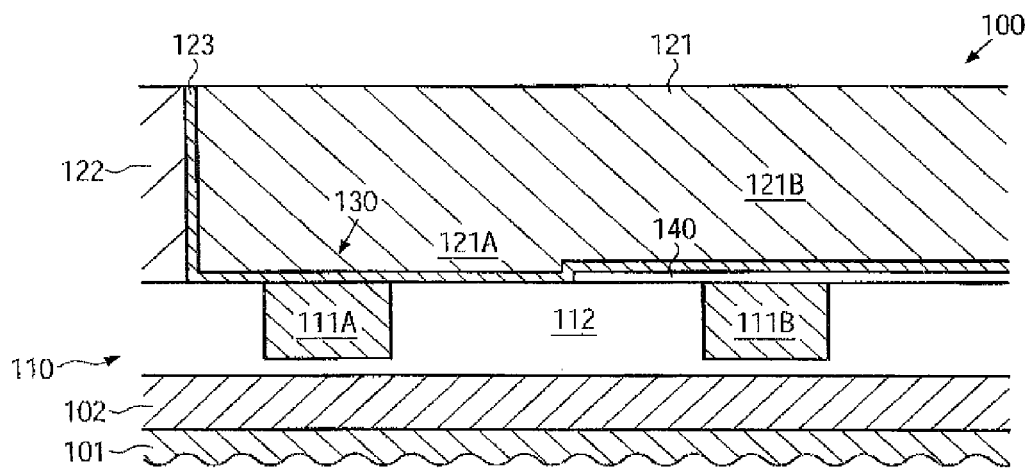

FIG. 1l schematically illustrates the semiconductor device 100 of FIG. 1k in a further advanced manufacturing stage in which the metal line 121 may have been formed on the basis of the above-described process technique, thereby providing a low overall resistance, irrespective of the lateral dimensions of the respective line portions 121A, 121B due to a comparable depth thereof, which may substantially differ by the thickness of the mask 140.

As previously explained, in many cases, an appropriate etch stop material may be provided on top of the metal layer 110 to confine the metal material and also to provide enhanced controllability of a respective etch process for finally exposing the metal surface of the underlying metal region. Hence, in embodiments in which the mask 140 may be formed at the bottom of the dielectric layer 122, the formation of a respective etch stop layer in combination with the mask material 140 may be adapted in an appropriate manner to enhance the overall patterning process for forming the openings 122V and 122T (FIG. 1f) for defining the interlayer connection 130 and the metal line 121.

With reference to FIGS. 1m-1p, further illustrative embodiments will now be described, in which forming the mask 140 is coordinated with the provision of a respective etch stop layer.

Figure 1M:
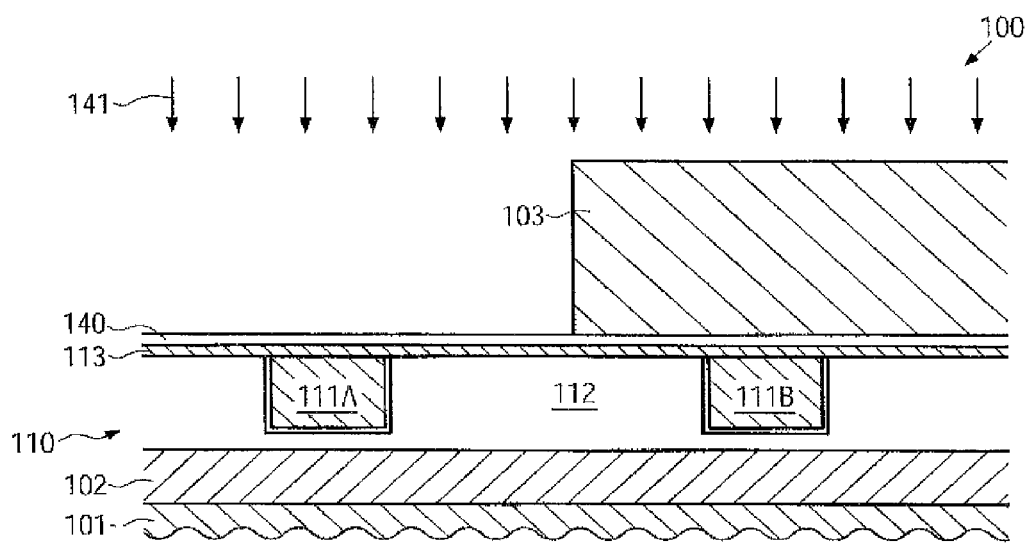

FIG. 1m schematically illustrates the semiconductor device 100 in a cross-sectional view, wherein a dielectric barrier layer 113 may be formed as a final layer of the metal layer 110, thereby confining the metal lines 111A, 111B and also covering surface portions of the dielectric layer 112. The dielectric barrier layer 113 may be provided in the form of silicon nitride, silicon carbide, nitrogen-enriched silicon carbide or any composition of these materials and the like. In this case, the dielectric barrier layer 113 may also provide sufficient diffusion blocking characteristics to suppress a diffusion of copper atoms into the surrounding dielectric material and also prevent direct contact of reactive components with the copper material. In other illustrative embodiments, the dielectric barrier layer 113 may be provided to act as an etch stop layer during the patterning of the overlying mask 140 without requiring copper diffusion blocking characteristics, when the metal lines 111A, 111B may comprise appropriate cap layers, for instance in the form of conductive cap layers, that may reliably confine the copper material while also providing enhanced electromigration performance and the like. For example, a plurality of copper alloys or cobalt-based compositions may be available to act as efficient cap layers for copper-based metal lines. Furthermore, as shown, the semiconductor device 100 may comprise, in this manufacturing stage, the mask 103 exposing a desired portion of the mask 140 during the etch process 141. The mask 140 may be provided as a material having the required etch stop capabilities during the subsequent etch process 105 (FIG. 1e) for patterning the openings for the metal line 121 (FIG. 1l). Moreover, the material of the mask 140 may be selectively etched with respect to the dielectric barrier layer 113, thereby enabling a high degree of process control of the etch process 141 and also substantially avoiding any damage of the dielectric material 112 and the metal lines 111A, 111B. After the patterning of the mask 140, the further processing may be continued, as is, for instance, described with reference to FIGS. 1k-1l. It should be appreciated that, during the etch process 105, the dielectric barrier layer 113 may also act as an efficient etch stop material, which may then be removed to actually expose the metal line 111A while the mask 140 may then prevent an exposure of the metal line 111B. For example, the mask 140 may be provided in the form of silicon dioxide or any other appropriate material having a high degree of etch selectivity with respect to the dielectric barrier layer 113, which may, for instance, be provided on the basis of conventional recipes, for instance including silicon nitride-based materials.

Figure 1N:
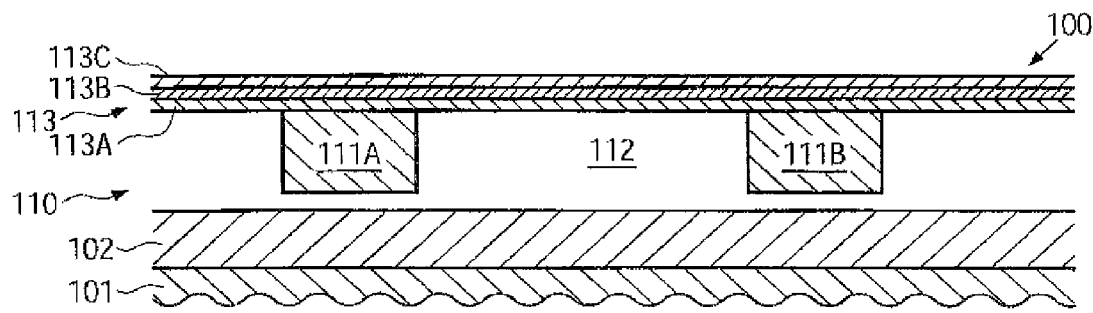

FIG. 1n schematically illustrates the semiconductor device 100 according to further illustrative embodiments, in which the dielectric barrier layer 113 may be provided in the form of a plurality of sub-layers 113A, 113B and 113C, the number and material composition of which may be selected so as to also include the function of the mask 140. That is, the dielectric barrier layer 113 may be formed on the basis of an appropriate process sequence to exhibit the desired characteristics in view of diffusion blocking, adhesion and the like, as well as etch stop capabilities, while also providing the possibility of acting as an efficient mask 140 during the patterning of the trench 122T and the opening 122V (see FIG. 1f). For example, the first layer 113A may be provided in a configuration corresponding to a conventional dielectric cap layer, while an uppermost layer 113C may represent material providing the desired etch stop capabilities according to the mask 140, as previously discussed. If the layers 113A, 113C have similar material characteristics, at least with respect to a plurality of etch chemistries, an appropriate layer 113B may be provided between the layers 113A and 113C to enhance the patterning of the layer 113C. For example, silicon nitride-based materials may be used for the layers 113A, 113C, thereby providing the required etch stop capabilities and also the confinement of the metal lines 111A, 111B, while the layer 113B may be provided in the form of a silicon dioxide-based material. In this manner, a high degree of compatibility with conventional strategies with respect to dielectric barrier layers may be obtained, for instance, by using similar materials in the layer 113A, while nevertheless allowing an efficient patterning of the layer 113C, which may act as the mask 140 during the subsequent patterning process. In some illustrative embodiments, the dielectric barrier layer 113 may be formed on the basis of an in situ process technique, wherein the precursor material may be appropriately changed to obtain the desired sequence of materials. Thereafter, the dielectric layer 113 may then be patterned to maintain the sub-layer 113A above the metal line 111A, while substantially completely maintaining the layer 113 above the metal line 111B.

Figure 1O:
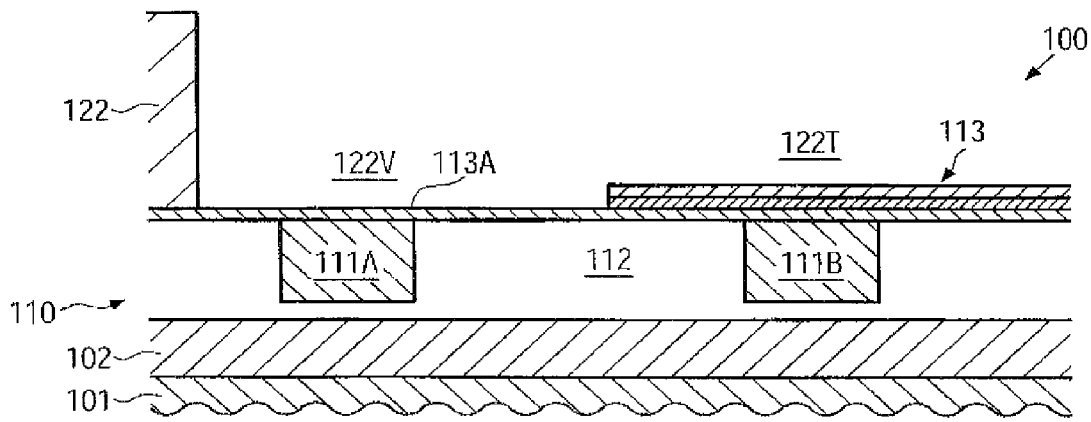

FIG. 1o schematically illustrates the semiconductor device 100 in a further advanced manufacturing stage, after the openings 122V and 122T have been patterned in the dielectric layer 122. As previously explained, the respective etch process may be reliably stopped on the basis of the sub-layer 113A to define the opening 122V and the layer 113B, thereby defining the trench 122T.

Figure 1P:
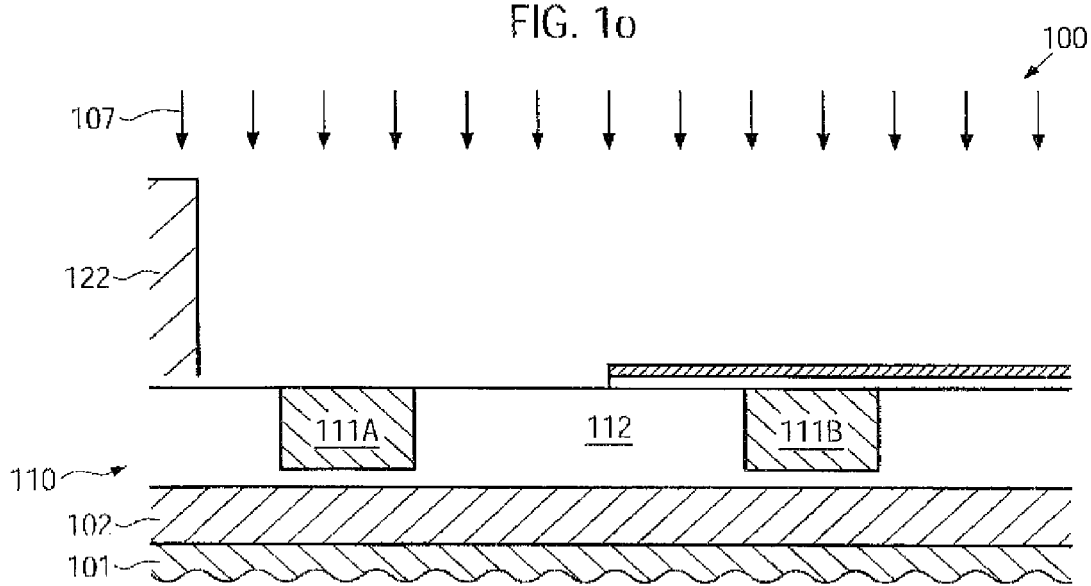

FIG. 1p schematically illustrates the semiconductor device 100 during an etch process 107 for removing the sub-layer 113A, thereby deepening the opening 122V to extend to a portion of the metal line 111A and also exposing portions of the dielectric layer 112. During the etch process 107, the layer 113C may also be removed, when similar materials have been used for the sub-layers 113A and 113C. However, in this case, the sub-layer 113B may act as an etch stop layer, thereby preventing undue material removal of the sub-layer 113A corresponding to the trench 122T. Thereafter, the further processing may be continued by depositing appropriate conductive materials, as previously explained. Consequently, the definition of the openings 122V and 122T may be efficiently combined with appropriate deposition techniques for forming dielectric barrier layers or etch stop layers, thereby also providing a high degree of process compatibility with conventional strategies for forming respective dielectric barriers or etch stop materials.

In the embodiments described above, the definition of the lateral position of the opening 122V may be accomplished on the basis of a hard mask material, i.e., the mask 140 or the patterned dielectric barrier layer 113 may be formed prior to the patterning process for etching the dielectric material, of the layer 122.

Figure 2A:
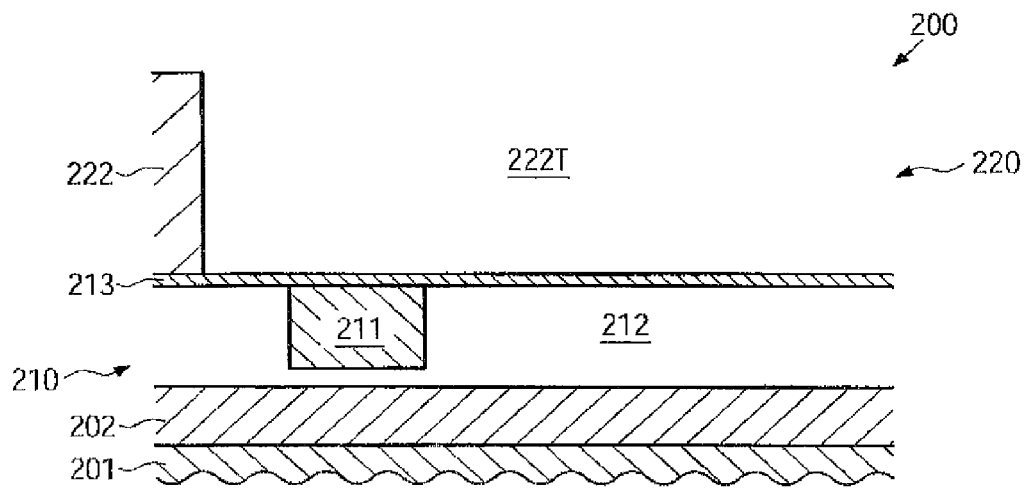
FIGS. 2$a$-2$c$ schematically illustrate cross-sectional views during various manufacturing stages in which the lateral position and size of the interlayer connection may be defined on the basis of a resist mask after patterning a trench extending through the interlayer dielectric material according to illustrative embodiments.
Figure 2B:
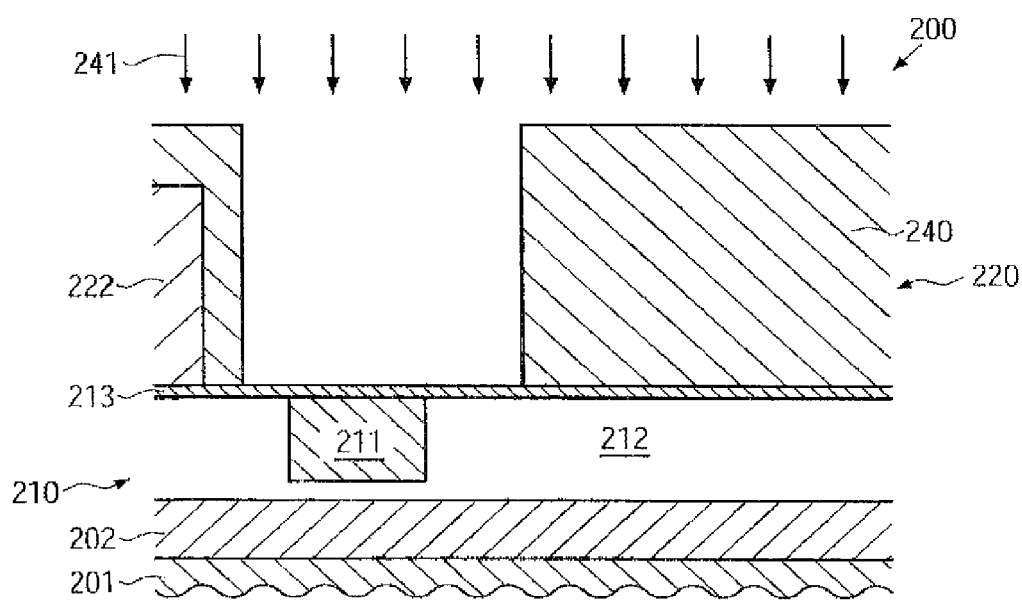
Figure 2C:
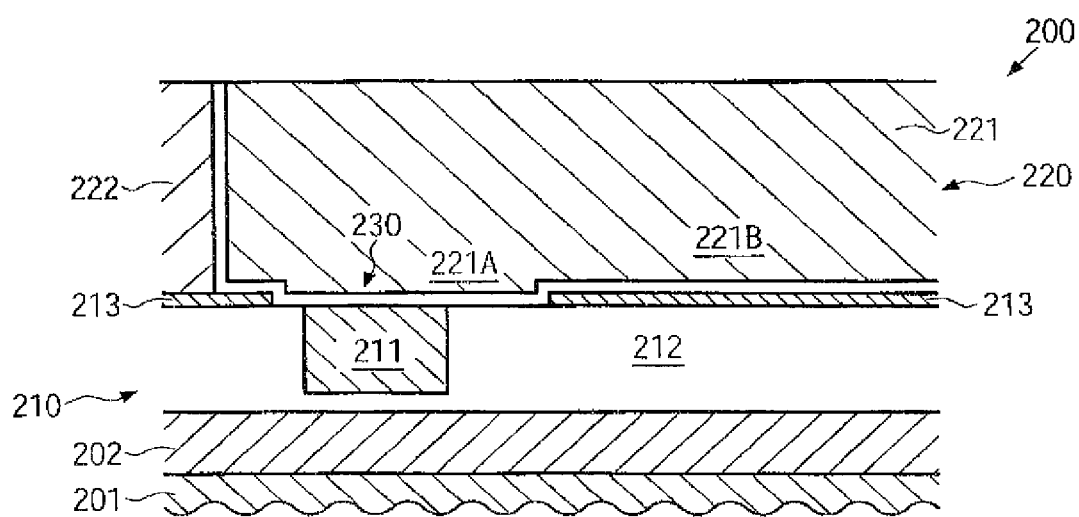

With reference to FIGS. 2a-2c, further illustrative embodiments will now be described, in which the definition of the lateral position may be performed after the patterning of the dielectric layer on the basis of any appropriate mask material, which may be subsequently removed.

FIG. 2a schematically illustrates a semiconductor device 200 comprising a substrate 201, a device layer 202 and a metal layer 210. With respect to these components, the same criteria apply as previously explained with reference to the semiconductor device 100, and a further detailed description thereof will be omitted. Furthermore, the metal layer 210 comprises a dielectric barrier layer 213 to cover a dielectric material 212 and also cover a metal region 211 formed in the dielectric material 212. For example, the metal region 211 may represent a metal line, such as the metal line 111A in the device 100. Furthermore, the semiconductor device 200 may comprise a patterned dielectric layer 222, which may represent the dielectric material for a further metal layer 220, which may have formed in the dielectric material 222 respective trenches 222T so as to define the lateral position of respective metal lines in the metal layer 220. It should be appreciated that the trenches 222T extend down to the dielectric barrier layer 213, thereby defining, contrary to conventional strategies, an increased thickness of the respective metal line, since the trench 222T extends through the entire thickness of the dielectric material 222. It should further be appreciated that the trench 222T has a specific width, i.e., an extension perpendicular to the drawing plane of FIG. 2a. Hence, a lateral dimension in the width direction of the trench 222T for interlayer connection to the metal region 211 is already defined by the trench 222T, while a lateral extension in the horizontal direction of FIG. 2a is not yet established.

With respect to any process techniques for forming the semiconductor device 200 as shown in FIG. 2a, the same criteria apply as previously explained with reference to the device 100, except for the provision of a mask 140. It should be appreciated that the dielectric barrier layer 213 may be formed on the basis of conventional recipes, where the etch selectivity during the respective patterning process for forming the trenches 222T in the material 222 is considered appropriate. In other cases, the dielectric barrier layer 213 may comprise, at least at an upper portion thereof, any appropriate material composition so as to provide the desired etch selectivity.

FIG. 2b schematically illustrates the semiconductor device 200 in a further advanced manufacturing stage in which a mask 240 may be provided to define a lateral extension of an area of the metal layer 212 that is to be exposed during an etch process 241 so as to establish an interlayer connection with the metal region 211. For instance, the mask 240 may be formed on the basis of any appropriate material, such as photoresist, polymer materials that may be patterned on the basis of photoresist and the like. For example, any appropriate photoresist material or polymer material may be deposited and may then be patterned on the basis of established lithography techniques to provide the mask 240. Thereafter, the exposed portion of the dielectric layer 213 may be removed during the process 241, thereby also exposing a desired portion of the metal region 211. Thereafter, the mask 240 may be removed, for instance on the basis of appropriate plasma assisted techniques such as plasma ashing or any other appropriate removal techniques including dry and/or wet chemical etch process. Next, the resulting openings in the dielectric layer 222 may be filled with a conductive material as required.

FIG. 2c schematically illustrates the semiconductor device 200 after the above-described process sequence, which may also include any appropriate planarization techniques. Thus, the semiconductor device 200 may comprise a metal line 221 comprising respective line portions 221A and 221B having a similar depth or thickness except for the thickness of the dielectric barrier layer 213, which prevents a contact of the line portion 221B with underlying metal regions in the metal layer 210. On the other hand, the line portion 221A provides an interlayer connection 230 to a portion of the metal region 211, wherein a lateral extension of the line portions 221A, 221B may be defined on the basis of the configuration of the mask 240, as previously explained. Thus, the mask material 240 for defining the sizes of the line portions 221A, 221B may be removed from the device 200 after the patterning process, thereby avoiding the introduction of any additional materials within the dielectric layer 220. Furthermore, well-established, dielectric barrier layers 213 may be efficiently used, thereby providing a high degree of compatibility with conventional process techniques.

With reference to FIGS. 3a-3h, further illustrative embodiments will now be described, in which the definition of the lateral position and size of an interlayer connection may be accomplished on the basis of a mask material that is provided above the dielectric layer during the patterning by an etch process.

Figure 3A:
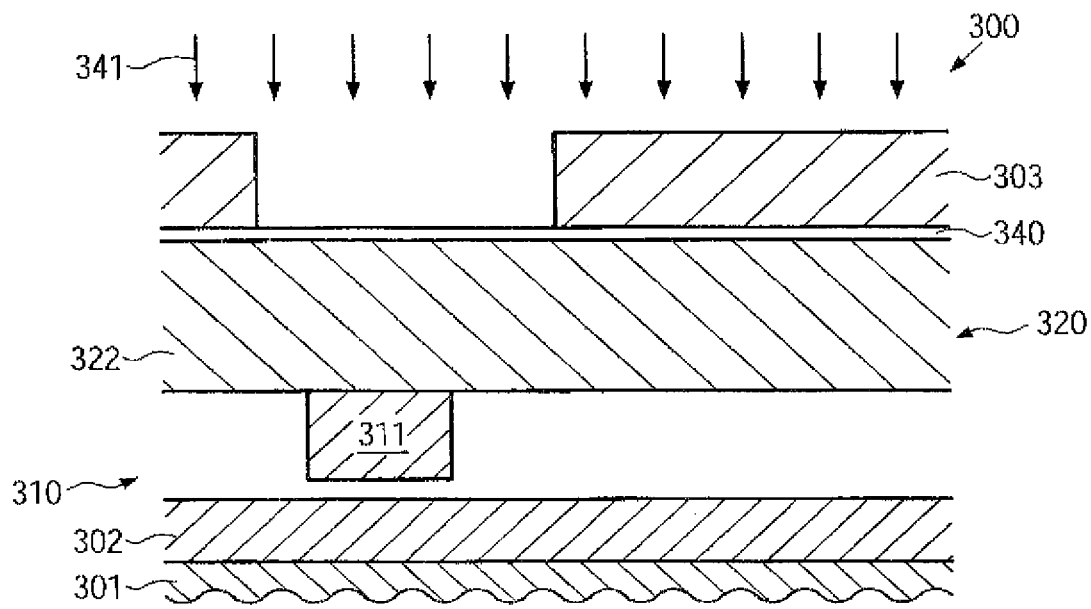
FIGS. 3$a$-3$d$ schematically illustrate cross-sectional views of a semiconductor device during various manufacturing stages, in which a trench and an opening for an interlayer connection are patterned in a common etch sequence on the basis of a hard mask for the interlayer connection that is formed above the interlayer dielectric material according to still further illustrative embodiments.
FIGS. 3e-3h schematically illustrate cross-sectional views for patterning an opening of an interlayer connection and a trench in a common etch process on the basis of modification of the interlayer dielectric material in order to appropriately pattern the etch behavior thereof.

FIG. 3a schematically illustrates a semiconductor device 300 in a cross-sectional view, which may comprise a substrate 301, which may possibly include a device layer 302, with a metal layer 310 including a dielectric material and a metal region 311, followed by a second metal layer 320, which in the manufacturing stage as shown may be comprised of a dielectric layer 322. With respect to the components described so far, the same criteria apply as previously explained with reference to the devices 100 and 200. Hence, a further detailed description thereof will be omitted. Furthermore, the semiconductor device 300 may further comprise a mask layer 340 and a mask 303, which may be provided in the form of a resist mask and the like. Thus, the semiconductor device 300 may be formed on the basis of substantially the same process techniques as described above, wherein, similar to the embodiments described with reference to FIGS. 2a-2c, any process sequence for defining a lateral position of an interlayer connection may be omitted. Next, the mask layer 340 may be formed on the basis of any appropriate material providing the desired etch selectivity during a subsequent patterning process. Thereafter, the mask 303 may be formed on the basis of photolithography, wherein, in this case, less restrictive process conditions are achieved. Next, the device 300 is subjected to an etch process 341 for patterning the mask layer 340, thereby exposing a portion of the dielectric layer 322. Next, the etch process 341 may be continued, possibly on the basis of a different etch chemistry, so as to etch into the material of the dielectric layer 322, while, in other cases, the mask 303 may be removed and an etch process may be performed on the basis of the patterned mask layer 340 to etch into the exposed portion of the dielectric layer 322.

Figure 3B:
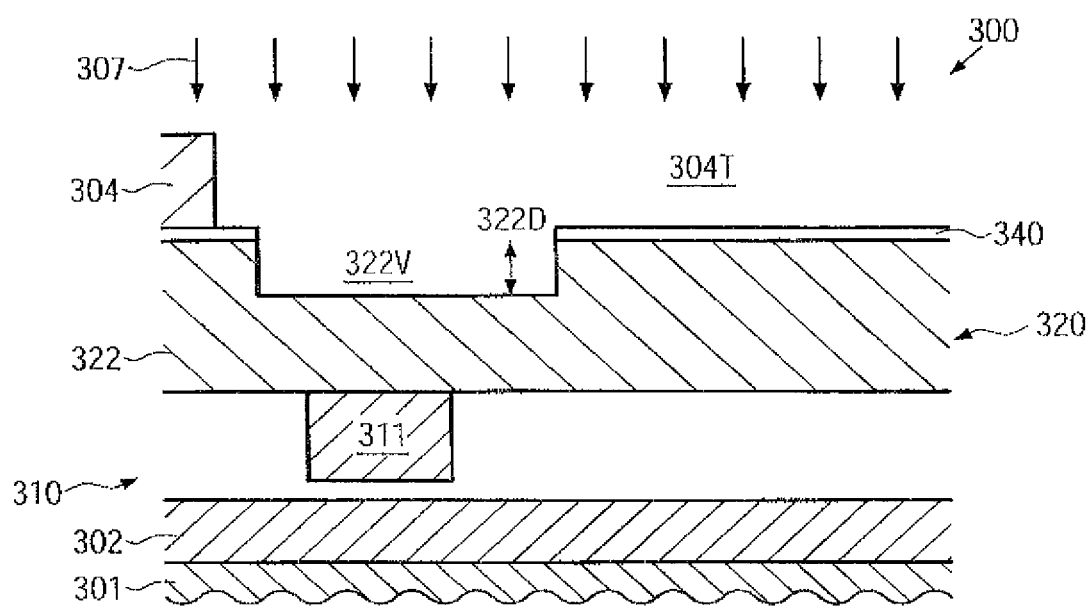

FIG. 3b schematically illustrates the semiconductor device 300 in a further advanced manufacturing stage, in which a further mask 304 is provided, which defines a respective trench 304T therein, which may substantially correspond to the position and lateral size of a metal line to be formed in the metal layer 320. Furthermore, during the previously performed etch process 341 or in a separate etch process, a respective opening 322V may be formed in the dielectric layer 322, wherein the opening 322V may extend to a first depth 322D. The semiconductor device 300 may then be subjected to an etch process 307 for removing the mask material 340 within the opening 304T defined by the mask 304. It should be appreciated that the etch process 307 may represent any appropriate etch technique, wherein a pronounced etch selectivity of the materials of the layer 340 and the dielectric layer 322 may not be required, as long as the initial depth 322D provides a sufficient etch lag in the area adjacent to the opening 322V during a subsequent common patterning process, as will be described later on.

Figure 3C:
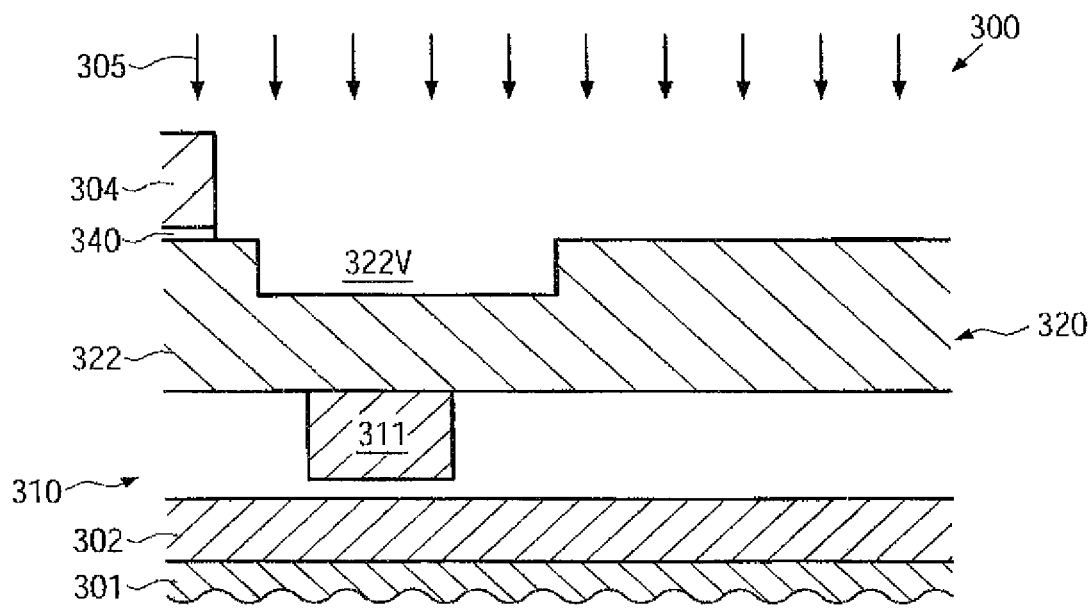

FIG. 3c schematically illustrates the semiconductor device 300 after the removal of the exposed portion of the layer 340 and during exposure to an etch ambient of an etch process 305 for forming a respective trench and for further deepening the opening 322V to extend down to the metal region 311.

Figure 3D:
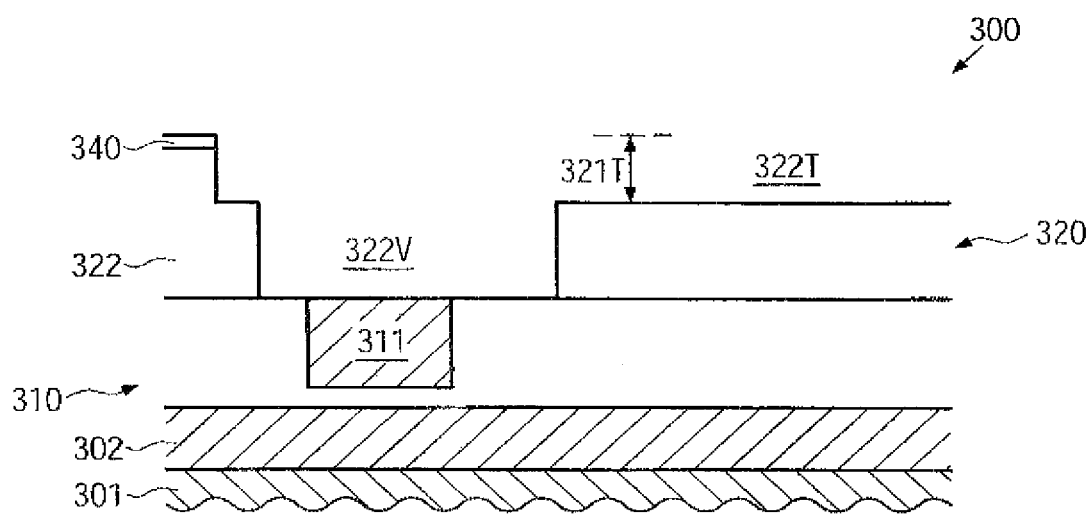

FIG. 3d schematically illustrates the semiconductor device 300 after finishing the etch process 305 and after removing the mask 304. Thus the opening 322V may extend down to the metal layer 311 and therefore may connect to a portion of the metal region 311, while a trench 322T is formed having a depth which may be substantially defined by the initial depth 322D (FIG. 3b), possibly in combination with an additional etch depth that may be created during the removal of the mask 340 within the trench, 322T. Consequently, the thickness 321T of the trench 322T may be created by an etch lag during the etch process 305 that has been obtained by providing the opening 322V with the initial depth 322D. It should be appreciated that the thickness 321T may also be influenced by a corresponding etch time that may be required for opening an etch stop layer, such as the dielectric barrier layers 113, 213 (not shown), if provided. Thereafter, the further processing may be continued, for instance, by removing the remaining mask layer 340, if deemed inappropriate for the further processing of the device 300. It should also be appreciated that, in some illustrative embodiments, the remaining mask layer 340 may be removed during a sequence for opening a respective dielectric barrier layer or etch stop layer at the bottom of the opening 322V, when similar materials are used for these layers. Then, a conductive material may be deposited as previously explained.

Thus, by providing the mask layer 340 on top of the dielectric layer 322, a high degree of process compatibility may be accomplished with conventional dual damascene strategies while nevertheless providing significantly enhanced overall controllability, in particular with respect to patterning an interlayer connection.

Figure 3E:
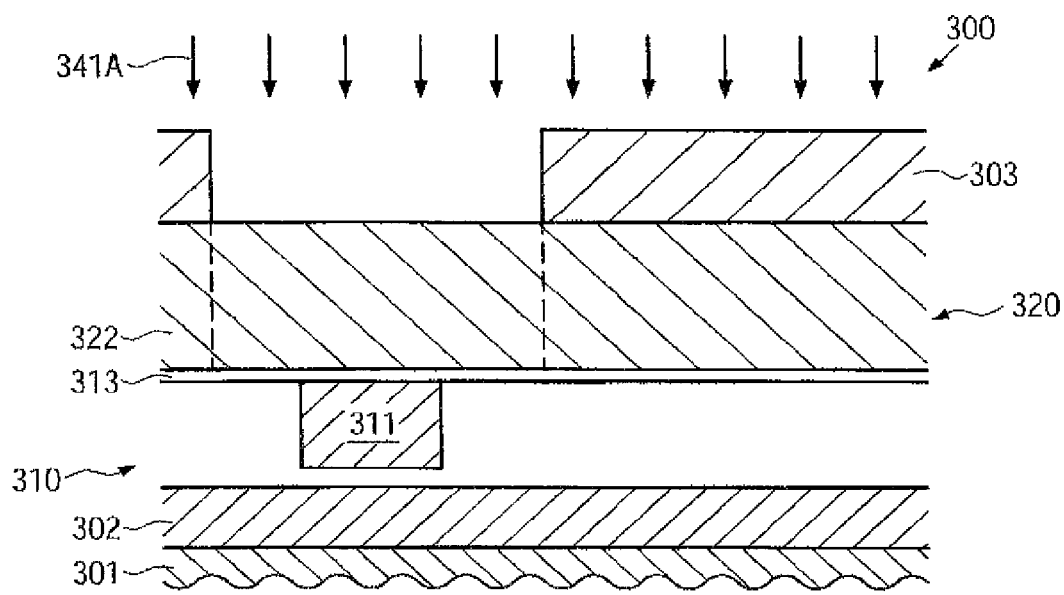

FIG. 3e schematically illustrates the semiconductor device 300 according to further illustrative embodiments. In this case, the mask 303, for instance in the form of a resist mask, may be provided above the dielectric material 322, without providing the mask layer 340. In some illustrative embodiments, a process 341A may be performed to obtain a different etch depth during a subsequent common etch process, such as the process 305. For example, the process 341A may comprise a first etch step for removing a certain portion of the dielectric layer 322 on the basis of the mask 303. Thereafter, the mask 303 may be removed and the mask 304 (not shown) may be formed and the etch, process may be continued so as to obtain a configuration as shown in FIG. 3d. Thus, in this case, an etch lag or delay for the trench portion 322T (FIG. 3d) may be obtained on the basis of the mask 303 and the process 341A, the duration of which may be adjusted so as to obtain the desired thickness 321T (FIG. 3d) while also maintaining the compatibility with the characteristics of the resist mask 303. That is, since the resist mask 303 may be provided with reduced thickness in sophisticated lithography techniques, the process 341A may be designed to allow a reliable anisotropic etch process without completely removing the resist mask 303.

In other illustrative embodiments, as shown in FIG. 3c, the process 341A may comprise a process for modifying the etch behavior of the dielectric layer 322 in a localized manner. In one illustrative embodiment, this may be accomplished on the basis of an ion implantation process in order to modify the molecular structure and thus increase the etch rate during a subsequent etch process. For example, ion bombardment with appropriate species, such as xenon and the like, may provide a modified etch behavior, at least at an upper portion thereof. That is, respective process parameters, such as implantation energy and dose, may be appropriately selected to avoid penetration of non-exposed portions of the dielectric layer 322, while efficiently altering the etch behavior of the exposed portions. Thereafter, the mask 303 may be removed and a further mask, such as the mask 304, may be formed to define the position and the lateral size of the trench.

Figure 3F:
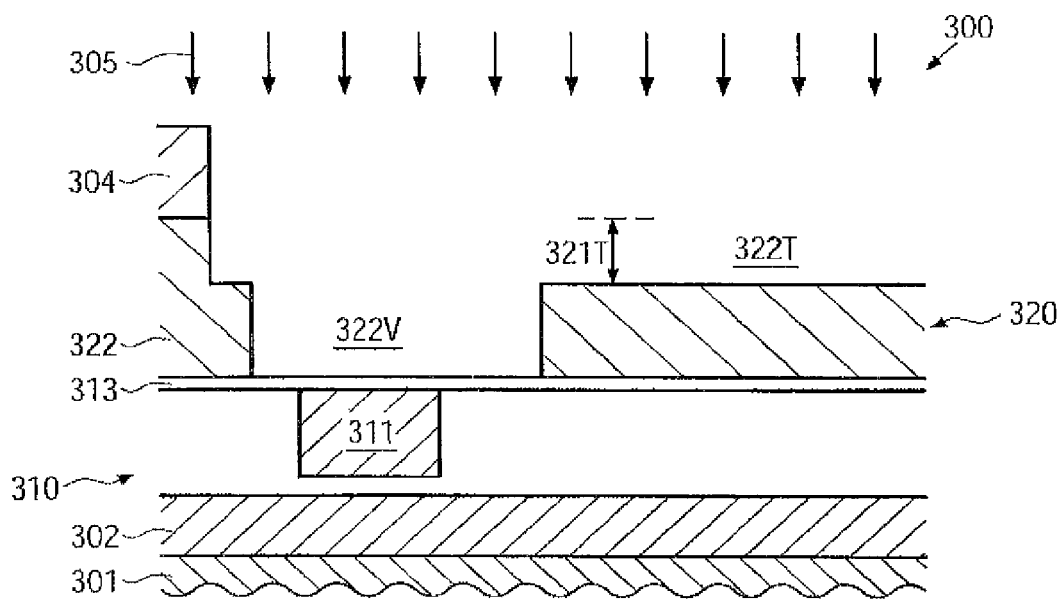

FIG. 3f schematically illustrates the device 300 during the etch process 305 based on the etch mask 304, wherein the process 305 may be reliably stopped on the basis of the dielectric etch stop layer or barrier layer 311. Thus, the thickness 321T of the trench 322T may be defined by the different etch rate of the material 322 corresponding to the opening 322V and the trench 322T, respectively.

Figure 3G:
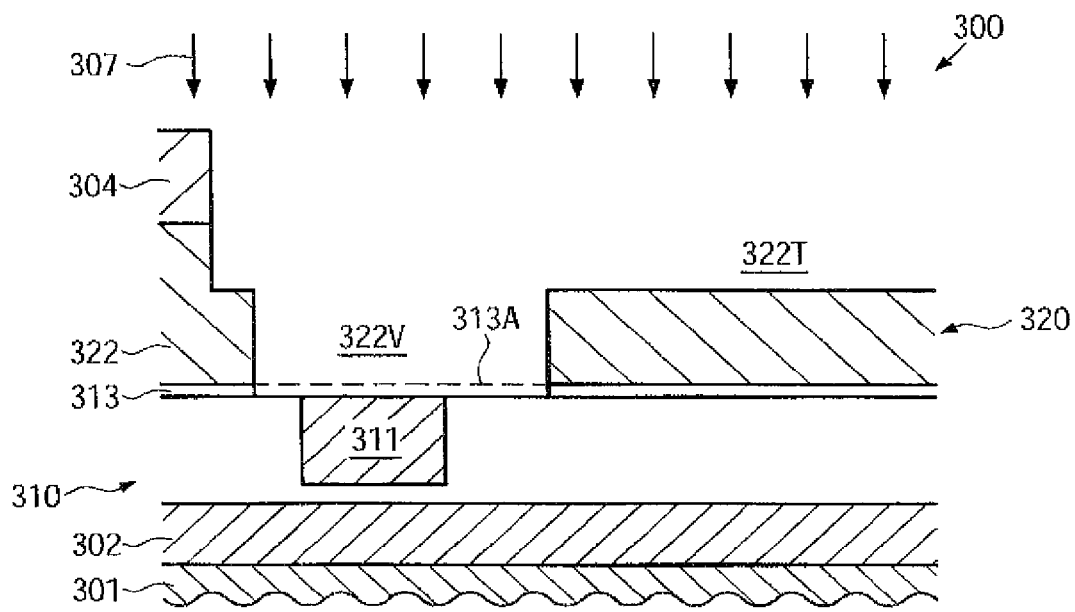

FIG. 3g schematically illustrates the device 300 during a further etch process 307, which may be performed on the basis of the mask 304 or wherein the mask 304 may have been removed, depending on the process strategy. The etch process 307 may be designed to remove at least a significant portion of the layer 313, while, in some illustrative embodiments, a portion 313A thereof may act as a stop layer, when exposure of the metal region 311 in this stage may be considered inappropriate. Thereafter, the further processing may be continued, for instance, by removing the mask 304 and finally removing layer 313A, if provided, followed by the deposition process, in order to form a metal line and a respective interlayer connection, as previously explained.

Figure 3H:
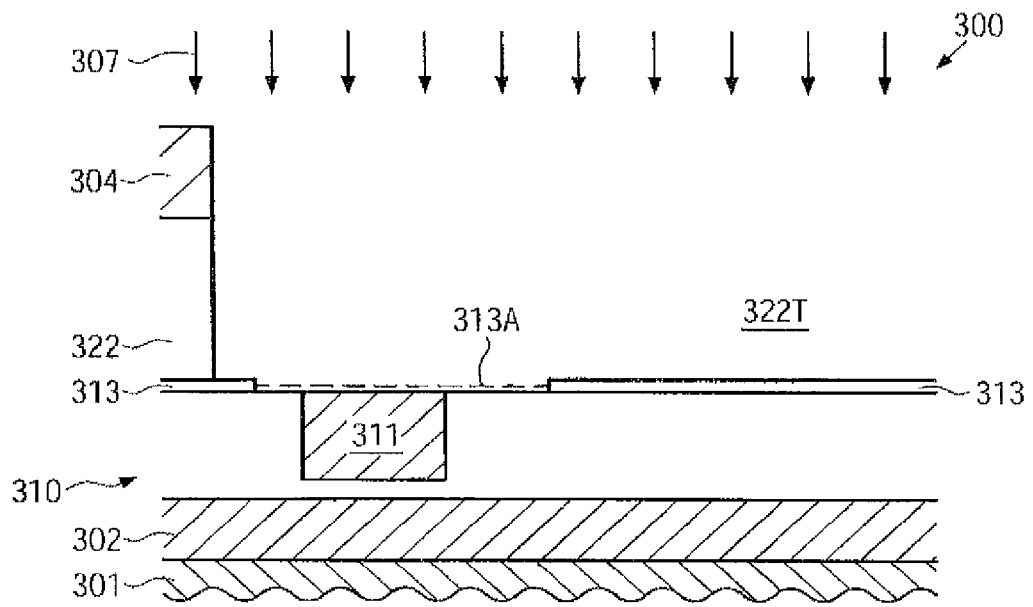

FIG. 3h schematically illustrates device 300 according to further illustrative embodiments, in which the etch process 307 may be continued on the basis of the mask 304 after opening the layer 313 or at least an upper portion thereof. That is, during the continuation of the process 307 as shown, the material of the dielectric layer 322 corresponding to the trench portion 322T may be further removed until the dielectric layer 313 is exposed, which may also act as an efficient etch stop layer during the process 307. Thereafter, the remaining portion 303 (FIG. 3e), if provided, may be removed, during the process 307, wherein the portion 313A may have moderately high etch selectivity with respect to the layer 313 or wherein the significantly reduced thickness of the portion 313A may result in a reliable exposure of the metal region 311, while also reliably maintaining covered other portions corresponding to the exposed layer 313.

Consequently, by continuing the etch process 307 as shown in FIG. 3h, a high degree of process uniformity may be obtained, since the depth of the respective trench 322T is determined on the basis of the layer 313. Thereafter, the further processing may be continued, as previously described.

As a result, the subject matter disclosed herein relates to semiconductor devices and methods for forming the same, in which metal regions and metal lines with increased thickness, at least partially, may be formed on the basis of a patterning regime with less restrictive constraints in view of the patterning of interlayer connections connecting to a lower lying metal layer. For this purpose, in some aspects, a hard mask material may be provided below or within the dielectric material of the metal layer to be patterned, wherein the hard mask material may be patterned on the basis of less critical process conditions, since, at least in one lateral direction, significantly greater dimensions may be used compared to conventional strategies. The respective size of the interlayer connection in the other lateral direction may be defined on the basis of the trench mask for the metal line to be formed, thereby enhancing the overall controllability of the patterning regime. In still other illustrative embodiments disclosed herein, the definition of the lateral position and size of the interlayer connection may be accomplished on the basis of a masking regime, in which the mask is formed above the dielectric layer to be patterned, while, in still other illustrative embodiments, the definition of the lateral size and position may be accomplished after the trench etch process. However, contrary to conventional concepts, the patterning process may be performed under significantly less sophisticated process conditions with respect to photolithography and etching.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
defining a lateral position of an interlayer connection between a first metal layer and a second metal layer of a semiconductor device by a first mask;
forming a second mask configured to define a trench in a dielectric material formed between said first and second metal layers, said trench corresponding to a metal line of said second metal layer, wherein defining said lateral position comprises forming said first mask above said dielectric material; and
forming an opening for said interlayer connection and said trench in said dielectric material in a common etch process, wherein performing said common etch process comprises etching material of said dielectric material on the basis of said first and second masks, removing said first mask and continuing etching material of said dielectric material on the basis of said second mask, wherein said first mask is formed so as to expose an area of said dielectric material corresponding to said opening and covering the remaining portion of said dielectric material and wherein said first mask is comprised of a material having a reduced etch rate compared to said dielectric material during said common etch process so as to generate an etch lag in said remaining portion.

2. A method, comprising:
patterning a first mask to expose a selected area of a first dielectric layer formed over a metal line so that the selected area encompasses an overlap region defined by an overlap of the metal line and a subsequently formed trench that extends in a direction substantially perpendicular to the metal line;
forming a second mask over a second dielectric layer over the first mask and the first dielectric layer and patterning the second mask to expose a second portion of the second dielectric layer corresponding to the trench;
forming an opening for the trench and an opening for an interlayer connection between the metal line and the trench using a common etch process through the first mask and the second mask patterned to define the trench, wherein forming the opening comprises performing a common anisotropic etch process to remove the second portion of the second dielectric layer exposed by the second mask, and wherein progression of the etch front substantially stops on the first mask while the etch process continues to remove portions of the first dielectric layer exposed by the first mask and the second mask.

3. The method of claim 2, wherein patterning the first mask comprises patterning the first mask to expose the selected area that has greater dimensions than the overlap region.

4. The method of claim 2, comprising filling the opening with a conductive material to form the trench and the interlayer connection between the metal line and the trench.

* * * * *